United States Patent
Brockmeier et al.

(10) Patent No.: US 11,046,577 B2
(45) Date of Patent: Jun. 29, 2021

(54) METHOD FOR PROCESSING A MONOCRYSTALLINE SUBSTRATE AND MICROMECHANICAL STRUCTURE

(71) Applicant: Infineon Technologies AG, Neubiberg (DE)

(72) Inventors: Andre Brockmeier, Villach (AT); Roland Rupp, Lauf (DE); Francisco Javier Santos Rodriguez, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/794,306

(22) Filed: Feb. 19, 2020

(65) Prior Publication Data

US 2020/0198963 A1    Jun. 25, 2020

Related U.S. Application Data

(62) Division of application No. 15/716,538, filed on Sep. 27, 2017, now Pat. No. 10,611,630.

(30) Foreign Application Priority Data

Sep. 27, 2016 (DE) .................. 10 2016 118 268.0

(51) Int. Cl.
   *B81C 1/00* (2006.01)
   *B81B 3/00* (2006.01)
(52) U.S. Cl.
   CPC .......... *B81C 1/0015* (2013.01); *B81B 3/0027* (2013.01); *B81B 3/0097* (2013.01); *B81C 1/00349* (2013.01); *B81C 1/00357* (2013.01); *B81B 2203/0118* (2013.01); *B81C 2201/0192* (2013.01)

(58) Field of Classification Search
   CPC .............. B81C 1/0015; B81C 1/00349; B81C 1/00357; B81B 3/0027; B81B 3/0097
   See application file for complete search history.

(56) References Cited

U.S. PATENT DOCUMENTS

| | | | |
|---|---|---|---|
| 2009/0278217 A1* | 11/2009 | Laming | H04R 7/18 257/419 |
| 2010/0012632 A1* | 1/2010 | Sakamoto | H01L 21/78 219/121.72 |
| 2011/0073967 A1 | 3/2011 | Chen et al. | |
| 2014/0072152 A1 | 3/2014 | Yang et al. | |

OTHER PUBLICATIONS

Smart cut, https://en.wikipedia.org/wiki/Smart_cut, retrieved on Nov. 24, 2020, 2 pages, Wikipedia.
Office Action issued for the corresponding German patent Application No. 10 2016 118 268.0, dated Nov. 26, 2020, 11 pages.

* cited by examiner

Primary Examiner — Marc Anthony Armand
(74) Attorney, Agent, or Firm — Viering, Jentschura & Partner mbB

(57) ABSTRACT

In various embodiments, a method of processing a monocrystalline substrate is provided. The method may include severing the substrate along a main processing side into at least two monocrystalline substrate segments, and forming a micromechanical structure comprising at least one monocrystalline substrate segment of the at least two substrate segments.

8 Claims, 17 Drawing Sheets

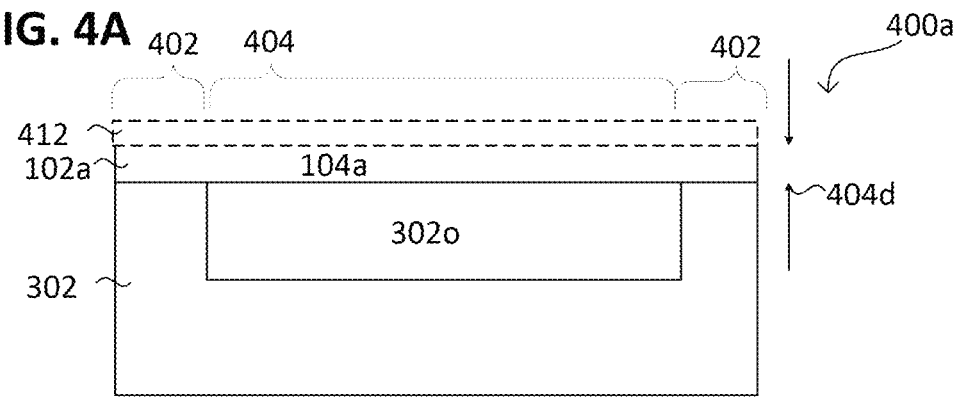
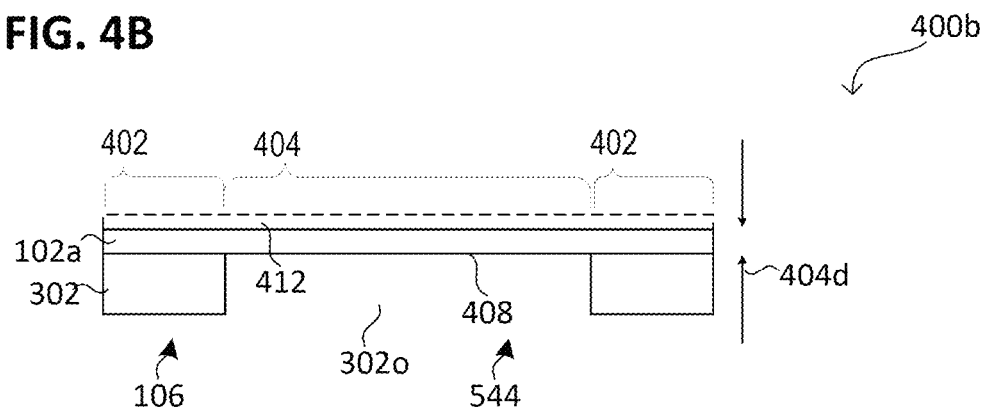
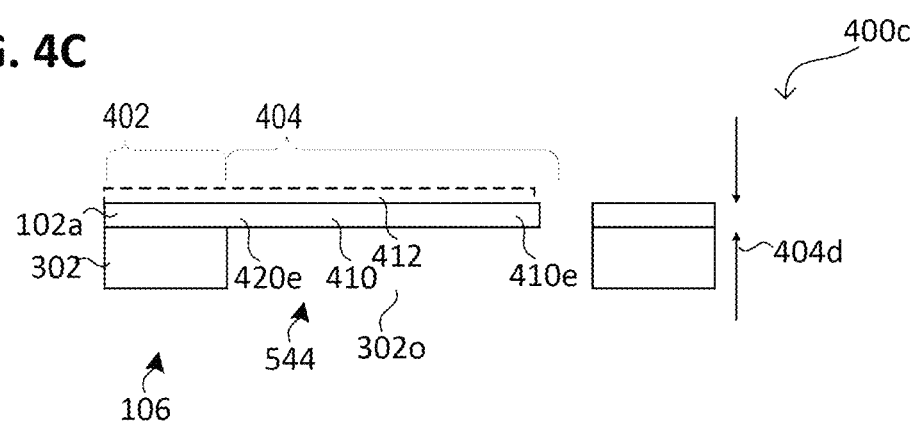

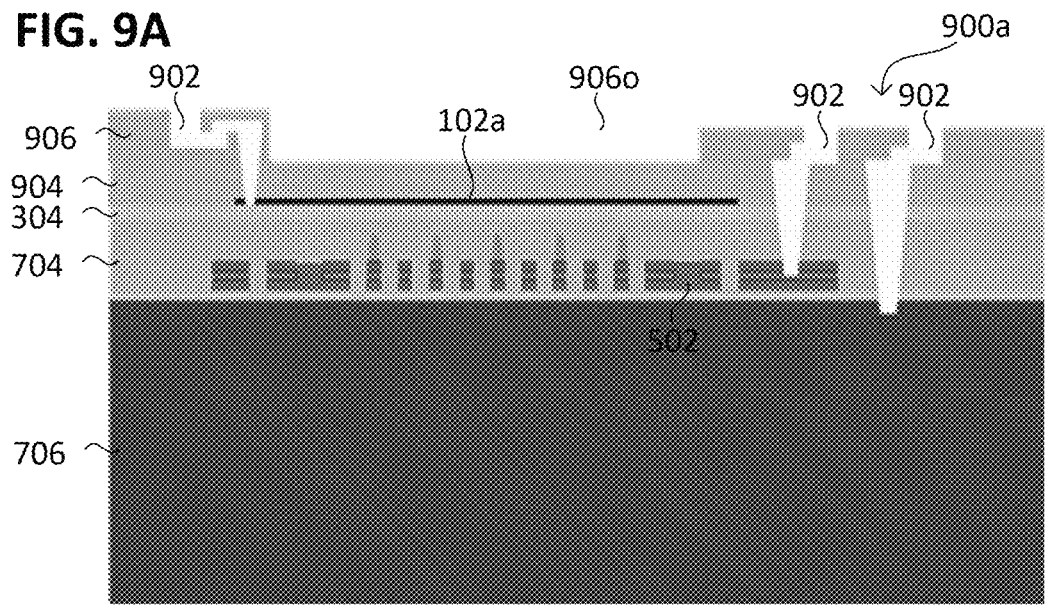
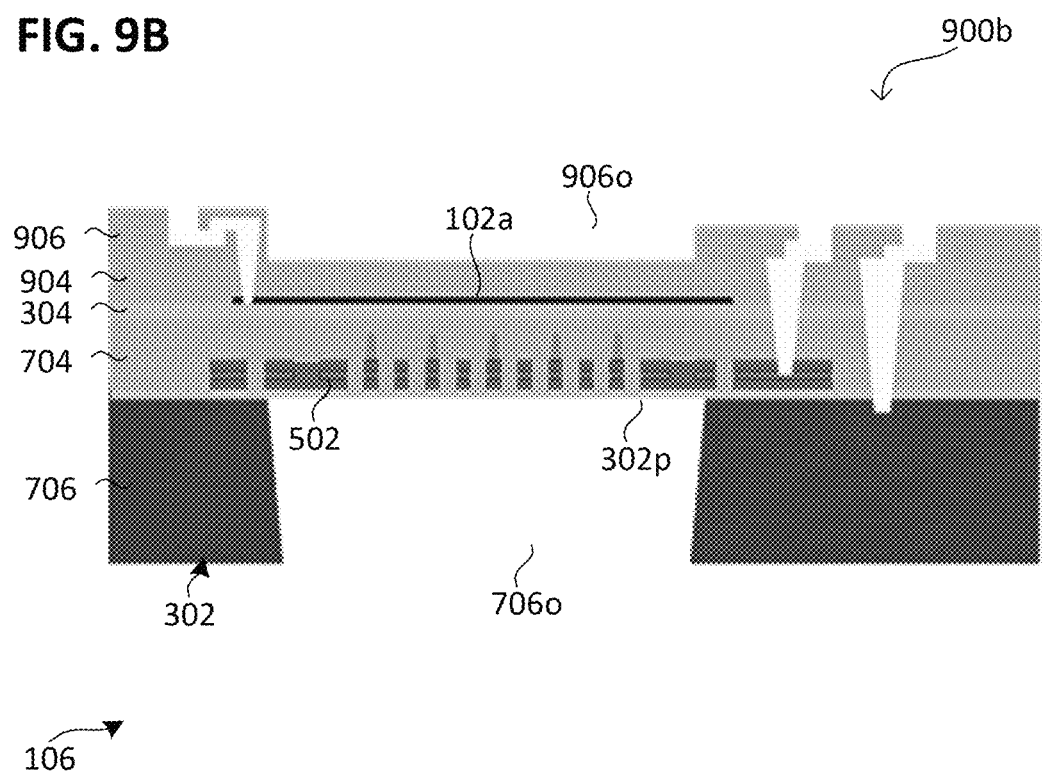

METHOD FOR PROCESSING A MONOCRYSTALLINE SUBSTRATE AND MICROMECHANICAL STRUCTURE

CROSS-REFERENCE TO RELATED APPLICATION

This application is a divisional application of U.S. application Ser. No. 15/716,538, which was filed on Sep. 27, 2017, which claims priority to German Patent Application Serial No. 10 2016 118 268.0, which was filed Sep. 27, 2016, both of which are incorporated herein by reference in their entirety.

TECHNICAL FIELD

Various embodiments relate generally to a method for processing a monocrystalline substrate and to a micromechanical structure.

BACKGROUND

In general a microelectromechanical system (MEMS) or a micromechanical system (MMS) can be integrated in small devices or systems which combine electrical and mechanical components with one another. By way of example, the term "micromechanics", related to micromechanical parts, can be used to describe small integrated devices or systems which include one or a plurality of micromechanical elements and possibly, but not necessarily, electrical components and/or electronic components.

In general a microelectromechanical system can be used to provide for example an electromechanical transducer, e.g. actuator or sensor. An MMS may include a deflectable structure, such as e.g. a membrane or a cantilever. Used as a drive, a microelectromechanical system (MEMS) may include one or a plurality of MMS whose deflectable structure can be electrically deflected. Used as a sensor (e.g. microphone), an MEMS can provide an electrical signal in reaction to a deflection (also referred to as stroke) of the deflectable structure of the MMS.

A microstructure such as, for example, a membrane in a microtransducer (for example microphone or microloudspeaker) or a cantilever in an atomic force microscope (AFM) can have stringent requirements, in particular in respect of the bending properties and/or the deflection behavior and the dynamic behavior under resonance conditions depending on the respective application.

Both the electrical and the mechanical requirements made of membrane-based sensors (e.g. microphones) increase with each successor generation and/or with the passage of time. By way of example, ever smaller sensors are demanded which tolerate higher loudness levels or the sound pressure level associated therewith, have a greater robustness and provide a higher signal-to-noise ratio (SNR).

As an assessment criterion for evaluating the quality and/or marketability of a sensor, both the SNR (Signal to Noise Ratio) value and the acoustic overload (also referred to as AOL) are of importance. A higher SNR enables the useful signal to be clearly demarcated from the background noise. At the same time the sensor should be able to clearly pick up a high sound pressure level (e.g. in concerts), without sound distortions occurring (also referred to as THD or total harmonic distortion). The electrical performance may be closely linked to the mechanical properties of the micromechanical structure.

By way of example, stringent requirements are made in respect of the mechanical robustness of a sensor for use in devices (e.g. in Smartphones, Smartwatches, Tablet PCs, Notebooks, Head-Sets or other everyday items of use) which are exposed both to mechanical loads (vibrations, fall) and to external environmental influences (dust, water, etc.). The higher the mass of the terminal device, the higher the mechanical load (illustratively pressure surge) can be for the microphone in the event of a so-called fall or impact of the device. In order to increase the robustness of a membrane-based sensor, conventionally various concepts are implemented, but they cannot simultaneously cover all requirements on account of the material systems available.

In one conventional concept, satisfying the requirement in respect of robustness, which requirement is (greatly) dependent on the mass of the terminal device, is controlled by way of the membrane thickness. The thicker the membrane, the more robust it is in the event of a dynamic pressure surge. However, this forces a compromise since, as the membrane thickness increases, the mechanical properties such as restoring behavior and sensitivity are also altered. In order to satisfy the requirements in respect of the restoring stress range while simultaneously complying with the sensitivity, a soft membrane composed of polysilicon (also referred to as poly-Si) is used, therefore, which is made additionally softer by its being implanted to a greater level. The smaller the membrane diameter, the lower the limit for implantation at which a degeneration of the poly-Si occurs, which leads to an additional induction of stress, with the result that the membrane buckles (also referred to as compressive membrane buckling at the implantation limit). The sensor thus becomes unusable, such that the maximum implantation of a small membrane diameter (e.g. less than 800 micrometers) is defined by the implantation limit.

Since there is a constantly increasingly endeavor to attain ever smaller devices, on account of the associated reduction of the housing sizes of the terminal devices it is necessary likewise to reduce the size of the MEMS and thus the membrane diameter. In order to retain the functionality of the MEMS it is necessary to comply with a sufficient distance from the implantation limit during implantation. Given a predefined restoring stress range, this can only be compensated for by reducing the membrane thickness, but this in turn results in a lower robustness.

In the case of small membrane diameters it is therefore conventionally accepted that the sensor has a low life expectancy or a low sensitivity.

In an alternative concept, geometric modifications that influence the mechanical properties are conventionally implemented on the MEMS. By way of example, so-called ventilation flaps are incorporated into the membrane, which attenuate a pressure surge and thus compensate for a lower robustness of the membrane. However, the ventilation flaps require a precise setting of the so-called corner frequency (or cut-off frequency). Alternatively, so-called corrugation rings are incorporated into the membrane, at which the membrane is corrugated. The implementation of the corrugation rings and/or of the ventilation flaps increases the production costs, generates additional stress points in the membrane and/or counterelectrode and increases the risk of the membrane "sticking" to other component parts, e.g. in the case of a double electrode configuration (also referred to as dual backplate arrangement).

SUMMARY

In various embodiments, a method of processing a monocrystalline substrate is provided. The method may include severing the substrate along a main processing side into at least two monocrystalline substrate segments, and forming a micromechanical structure comprising at least one monocrystalline substrate segment of the at least two substrate segments.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 4A to 4C show in each case a micromechanical structure in a method in accordance with various embodiments;

FIGS. 9A and 9B show in each case a micromechanical structure in a method in accordance with various embodiments;

DESCRIPTION

Figure 1A:
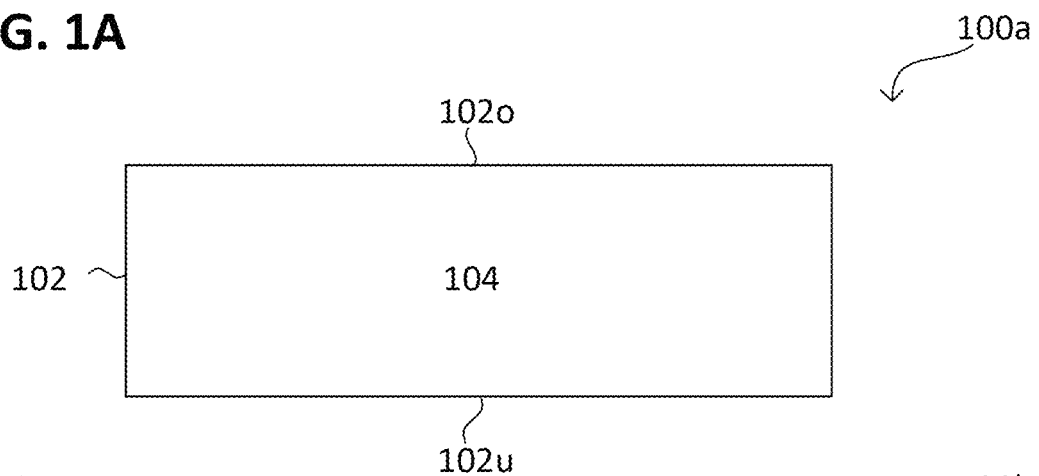
FIGS. 1A to 1C show in each case a micromechanical structure in a method in accordance with various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various exemplary embodiments described herein can be combined with one another, unless specifically indicated otherwise. Therefore, the following detailed description should not be interpreted in a restrictive sense, and the scope of protection of the present invention is defined by the appended claims.

The term "exemplary" is used here with the meaning "serving as an example, exemplar or illustration". Any embodiment or configuration that is described here as "exemplary" should not necessarily be understood as preferred or advantageous vis-à-vis other embodiments or configurations.

The term "above" with respect to deposited material that is formed "above" a side or surface can be understood in accordance with various embodiments to mean that the deposited material is formed "directly on", e.g. in direct (e.g. physical or adjoining) contact with, the stated side or surface. The term "above" with respect to a deposited material that is formed "above" a side or surface can be understood in accordance with various embodiments to mean that the deposited material is formed "indirectly on" the stated side or surface, wherein one or a plurality of additional layers are arranged between the stated side or surface and the deposited material. The deposition of the material can be carried out for example by means of chemical vapor deposition (CVD) or physical vapor deposition (PVD).

The term "lateral" or "laterally" with respect to the "lateral" extent of a structure (or of a substrate, a wafer or a carrier) or "laterally" adjoining can be used in accordance with various embodiments to denote an extent or a positional relationship along a surface of a substrate, a wafer or a carrier. That means that a surface of a substrate (for example a surface of a carrier or a surface of a wafer) can serve as a reference which is generally designated as the main processing surface of the substrate (or the main processing surface of the carrier or of the wafer). Furthermore, the term "width", which is used with regard to a "width" of a structure (or of a structure element) can be used here to denote the lateral extent of a structure.

Furthermore, the term "height", which is used with respect to a height of a structure (or of a structure element), can be used here to denote the extent of a structure along a direction perpendicular to the surface of a substrate (e.g. perpendicular to the main processing surface of a substrate), i.e. a vertical extent. The term "thickness", which is used with regard to a "thickness" of a layer, can be used here to denote the spatial extent of the layer perpendicular to the surface of the carrier (of the material) on which the layer is deposited, i.e. a vertical extent. If the surface of the carrier is parallel to the surface of the substrate (for example to the main processing surface), the thickness of the layer applied on the carrier can be equal to the height of the layer. Furthermore, a "vertical" structure can denote a structure which extends in a direction perpendicular to the lateral direction (e.g. perpendicular to the main processing surface of a substrate), and a "vertical" extent can denote an extent along a direction perpendicular to a lateral direction (for example an extent perpendicular to the main processing surface of a substrate).

In the context of this description, the terms "connected" and "coupled" are used to describe both a direct and an indirect connection (e.g. ohmically and/or electrically conductive, e.g. an electrically conductive connection) and a direct or indirect coupling. In the figures, identical or similar elements are provided with identical reference signs, in so far as this is expedient. A coupling can be understood as a mechanical coupling.

The term "formed therefrom" with respect to the fact that a first structure (e.g. body, layer, section) is formed from a second structure (e.g. body, layer, section) can be understood to mean that the second structure is used for forming the first structure, that is to say that the first structure includes at least one part of the second structure. For the purpose of forming the first structure, the second structure can optionally be processed (e.g. chemically, electrically and/or structurally altered), for example material can be removed from and/or added to it, it can be reshaped or cleaned. Alternatively, the second structure can be transformed into the first structure without alteration.

In the context of this description, a metal (also referred to as metallic material) may include at least one metallic element (i.e. one or a plurality of metallic elements) (or be formed therefrom), e.g. at least one element from the following group of elements: copper (Cu), iron (Fe), titanium (Ti), nickel (Ni), silver (Ag), chromium (Cr), platinum (Pt), gold (Au), magnesium (Mg), aluminum (Al), zirconium (Zr), tantalum (Ta), molybdenum (Mo), tungsten (W), vanadium (V), barium (Ba), indium (In), calcium (Ca), hafnium (Hf), samarium (Sm), silver (Ag), and/or lithium (Li). Furthermore, a metal may include a metallic compound (e.g. an intermetallic compound or an alloy) or be formed therefrom, e.g. a compound including at least two metallic elements (e.g. from the group of elements), such as e.g. bronze or brass, or e.g. a compound including at least one metallic element (e.g. from the group of elements) and at least one nonmetallic element (e.g. carbon), such as e.g. steel. Optionally, the metal may include alloying elements (whose proportion by mass is e.g. less than 10%, e.g. individually or in total), e.g. chromium, silicon, molybdenum, nickel, vanadium, carbon, manganese, phosphorus, silver, tin, zinc.

Microphones and/or microloudspeakers which are realized using chip technology are usually fabricated using silicon technology. Silicon microphones processed by micromachining are capacitive transducers having a flexible membrane, which moves in the sound field, and having a static perforated electrode, which is referred to as a backplate or an electrode. In accordance with the concept of excess pressure, the membrane can be exposed to pressure differences of up to 10 bar. In such cases, conventional membranes fail since their breaking strength or a maximum mechanical loading (e.g. force or stress) that the membrane can withstand (breaking resistance) is exceeded.

In accordance with various embodiments, a micromechanical system or a microelectromechanical system can be used to provide an actuator or sensor, for example.

In accordance with various embodiments, an electromechanical (e.g. sensor-based or actuator-based) transducer (e.g. sound transducer) is provided which includes a monocrystalline substrate segment. The actuator-based transducer complementary to the sensor-based transducer may include a microloudspeaker, for example, which has to be actuated in order to bring about a stroke, which generates an air displacement and therefore a sound pressure level.

A functional structure of a micromechanical structure, such as a membrane, for example, can be clamped, i.e. be fixed to an anchored (i.e. clamped, embedded and/or fixed) section (also referred to as securing section) and be vibratable or deflectable in the cantilevered section. The deflectable region can be part of the cantilevered section (also referred to as freely suspended section). By way of example, the anchored section and the cantilevered section can be monocrystalline (e.g. monolithically and/or in a manner adjoining one another) and/or be formed by means of processing of the monocrystalline substrate piece.

A micromechanical system (MMS) or microelectromechanical system (MMS with an electrical component) can generally be used as an actuator or sensor. By way of example, the system can be configured to convert between electrical energy and mechanical energy.

In accordance with various embodiments, it has been recognized that integration of SiC into a microelectromechanical system (such as e.g. a microphone) provides a multiplicity of possibilities. In comparison with poly-Si, SiC has a higher mechanical hardness and a higher elastic modulus (also referred to as modulus of elasticity or Young's modulus). By way of example, poly-Si can have a mechanical hardness of approximately 12.5 gigapascals (GPa) and an elastic modulus of approximately 180 GPa. By contrast, SiC can have a mechanical hardness in a range of approximately 20 GPa to approximately 50 GPa and an elastic modulus in a range of approximately 200 GPa to approximately 600 GPa. Optionally, in accordance with various embodiments, by means of introducing impurity atoms into the SiC, the elastic modulus thereof can be reduced, for example to 500 GPa or less (and/or more than 200 GPa).

The greater hardness properties of SiC can contribute to protecting the micromechanical structure (e.g. the membrane thereof) against damage, e.g. against membrane damage caused externally. Besides the mechanical hardness, the elastic modulus and an optional prestress of the SiC layer (illustratively internal strain, which can be caused artificially, for example) can influence the mechanical properties of the micromechanical structure. In the case of small deflections of the membrane, the layer stress can dominate the deflection behavior, and the influence of the elastic modulus can increase with increasing deflection of the membrane.

In general, in accordance with various embodiments, the SiC membrane can be made thinner than a membrane composed of poly-SiC, without losing robustness in the process. A thinner membrane can enable a greater deflection, such that smaller pressure differences can be detected with a good signal level. In other words, a thinner membrane can promote a greater sensitivity and/or a greater SNR.

The mechanical properties (e.g. oscillation properties and/or prestress) and the electrical properties (e.g. electrical conductivity) of SiC can optionally be modified subsequently, e.g. by means of the implantation of nitrogen ($N_2$).

The inert, chemical properties, such as e.g. the hydrophobicity (low tendency toward adhesion), of the SiC material can have a tendency toward particle contamination and/or reduce the risk of sticking of the membrane.

Optionally, the monocrystalline material (e.g. semiconductor material), e.g. monocrystalline SiC, may not be used exclusively as membrane material, but rather also as stabilization below a poly-Si membrane. It is thereby possible to combine a conventional method of layer modification of poly-Si with the mechanical properties of the monocrystalline material (e.g. SiC). In accordance with various embodiments, SiC can be provided as membrane material or as stabilizer of a polysilicon membrane. In contrast to a conventional membrane, SiC can be made thinner and/or can experience greater deflections, without being damaged.

In accordance with various embodiments, "monocrystalline" or "single crystal" with regard to a crystallization type, a material or a body (e.g. a substrate, the substrate segment thereof or a layer) can be understood to mean that its building blocks (i.e. atoms, ions or molecules) form a substantially continuous, uniform, homogeneous (illustratively macroscopic) crystal lattice. In other words, the monocrystalline crystal lattice can have a uniform alignment (also referred to as main alignment), that is to say that the spatially averaged orientation of the crystal building blocks can be substantially identical.

This differentiates the monocrystalline crystallization type from a polycrystalline crystallization type, twinned crystallization type or an amorphous material (non-crystalline material). The amorphous material can have an arbitrary alignment and/or arrangement of the building blocks. The polycrystalline crystallization type and/or the twinned crystallization type may include or be formed from a multiplicity of (illustratively microscopic) crystalline grains (crystallites) which are separated from one another by grain boundaries.

In general, the differentiation in the crystallization type can be understood as differentiation in the main alignment of the crystal structure and/or as differentiation in the average deviation from the main alignment of the crystal structure. A monocrystalline crystallization type can have a smaller average deviation from the main alignment and/or a lower spatial density of grain boundaries and/or crystallites than a polycrystalline crystallization type or than a twinned crystallization type.

In accordance with various embodiments, a substrate (e.g. including the monocrystalline partial region) can be processed in order to form one or a plurality of functional structures, e.g. separated from one another or interconnected with one another. A plurality of functional structures interconnected with one another can form for example an electronic circuit, e.g. a sensor array. In general, one micromechanical structure or a plurality of micromechanical structures can be formed and/or integrated in the substrate (also referred to as chips or semiconductor chips).

Each or the micromechanical structure may include a functional structure. The functional structure can be arranged in a part of the substrate and may include at least one functional region (exactly one functional region or a plurality of functional regions), such as, for example, at least one membrane or at least one cantilever. The at least one functional region can be configured for deflection, e.g. as a reaction to a mechanical signal or an electrical signal, e.g. in power electronics (e.g. using power components).

In accordance with various embodiments, a micromechanical structure (also referred to as an integrated micromechanical structure or micromechanical chip) can be singulated from the substrate (or from a semiconductor wafer) by material being removed from a kerf of the substrate (also referred to as dividing or cutting apart the substrate). By way of example, material can be removed from the kerf of the substrate by scribing and breaking, splitting, blade dividing (separation), plasma dividing (separation), laser dividing or mechanical sawing (for example by using a separating saw). After the micromechanical chip has been singulated, it can be electrically contacted and subsequently encapsulated (e.g. in a closed or half-open fashion), e.g. by means of a molding material and/or into a chip carrier (also referred to as chip package) suitable for use in an electronic device. By way of example, the micromechanical chip can be connected by means of wires within the chip carrier and/or the chip carrier can be soldered on a printed circuit board and/or onto a leadframe.

The term semiconductor material can be understood to mean a chemical composition which includes a semiconducting base material or is formed therefrom and/or is semiconducting in an undoped state, i.e. has an electrical conductivity in a range of approximately $10^{-6}$ siemens/meter to approximately $10^6$ siemens/meter. During the processing of the semiconductor material, the semiconducting base material can be doped in sections, for example, which increases its electrical conductivity in the doped locations (e.g. above $10^6$ siemens/meter). The semiconductor material or the semiconducting base material can for example include or be formed from an elemental semiconductor (e.g. silicon or germanium) or a compound semiconductor (e.g. silicon carbide or SiGe).

In accordance with various embodiments, a substrate (e.g. its substrate segments) or a semiconductor region (e.g. the monocrystalline region) may include or be formed from a semiconductor material (e.g. the semiconducting base material) of one type or of different types, including group IV semiconductors (e.g. silicon or germanium), compound semiconductors, e.g. group III-V compound semiconductors (for example gallium arsenide), group III semiconductors, group V semiconductors or semiconducting polymers. In a plurality of embodiments, the substrate and/or the semiconductor region (e.g. the circuit region thereof) can be formed from silicon (doped or undoped). In a plurality of alternative embodiments, the substrate can be a silicon-on-insulator (SOI) wafer (e.g. the second substrate). As an alternative, any other suitable semiconductor material can be used for the substrate and/or the semiconductor region, for example a semiconductor compound (semiconducting chemical compound) such as gallium phosphide (GPa), indium phosphide (InP), silicon carbide (SIC) or gallium nitride (GaN), but also any suitable ternary semiconductor compound or quaternary semiconductor compound, such as, for example, indium gallium arsenide (InGaAs).

Illustratively, the method provided in accordance with various embodiments can result in a micromechanical structure whose monocrystalline layer illustratively is chemically purer, and has fewer twin boundaries and a larger thickness, e.g. more than 10 nanometers (topmost boundary, which is possible by means of conventional carbonization). Furthermore, the monocrystalline layer provided can be strain-neutral, i.e. be produced without a prestress, which increases the room for subsequent adaptation.

Figure 1B:
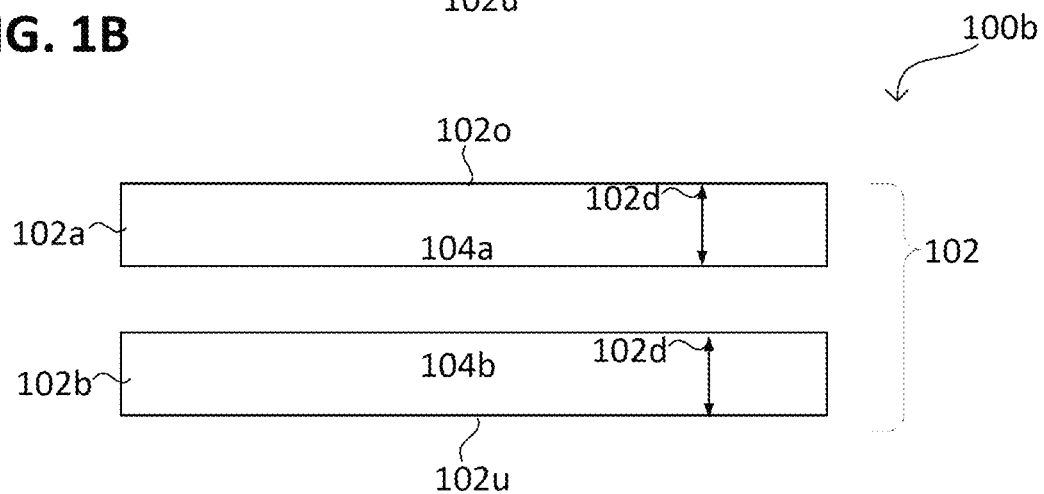
Figure 1C:
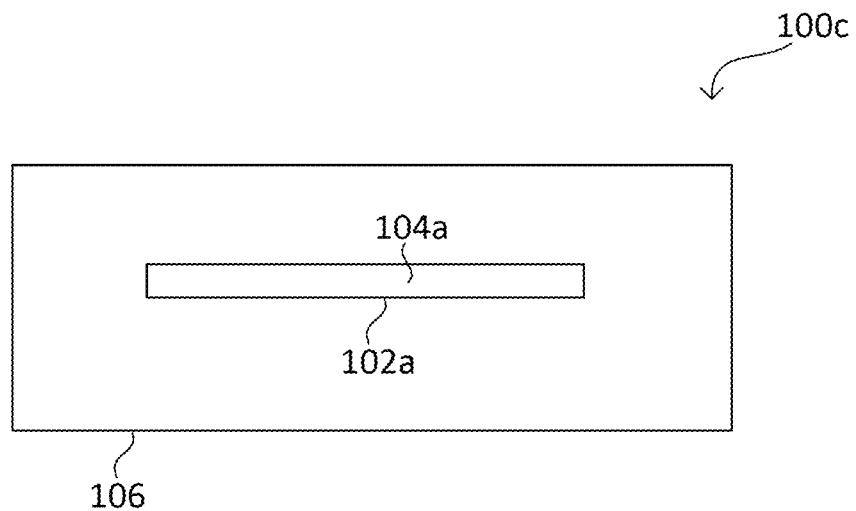

FIG. 1A, FIG. 1B and FIG. 1C illustrate in each case a method with various embodiments in a schematic side view or cross-sectional view (e.g. with the viewing direction along a main processing side 102o).

The method may include, in 100a: providing a substrate 102, which includes or is formed from a monocrystalline region 104 (also referred to as a single-crystal region 104), e.g. providing a monocrystalline substrate 102. The substrate 102 may include two main processing sides 102o, 102u, which are situated opposite one another. By way of example, the substrate 102 and/or the single-crystal region 104 may include or be formed from a monocrystalline semiconductor material, e.g. monocrystalline GaN, monocrystalline SiC and/or monocrystalline Si. The monocrystalline SiC can be present for example in a hexagonal crystal configuration (for example a 4H configuration). The hexagonal crystal configuration can have particularly few twin boundaries. In other words, the substrate 102 and/or the single-crystal region 104 may include or be formed from monocrystalline hexagonal SiC. The 4H configuration may include or be formed from a mixture of a purely hexagonal crystal portion and a purely cubic crystal portion.

The method can furthermore include, in 100b: severing the substrate 102 along a (e.g. first) main processing side 102o (e.g. parallel thereto) into at least two substrate segments 102a, 102b, each of which includes or is formed from a monocrystalline partial region 104a, 104b of the single-crystal region 104, e.g. into at least two monocrystalline substrate segments 102a, 102b. By way of example, the severing may include: severing the single-crystal region 104 into two monocrystalline partial regions 104a, 104b.

The method can furthermore include, in 100c: forming a micromechanical structure 106 including a substrate segment 102a (also referred to as first substrate segment 102a) of the at least two substrate segments 102a, 102b or at least one monocrystalline partial region 104a (also referred to as first partial region 104a) of the two monocrystalline partial regions 104a, 104b.

By way of example, the first substrate segment 102a used for forming the micromechanical structure 106 may include a monocrystalline layer 104a or be formed therefrom (or at least from a part thereof). Alternatively or additionally, the two substrate segments 102a, 102b can differ in their vertical extent 102d, 112d; by way of example, the ratio of the vertical extents 102d, 112d can be more than approximately 10, e.g. more than approximately 100, e.g. more than approximately 1000. By way of example, the first substrate segment 102a can have a vertical extent 102d (i.e. transverse extent with respect to the main processing side 102o) smaller than the other substrate segment 102b (also referred to as second substrate segment 102b), e.g. less than approximately 10% of the vertical extent 112d of the second substrate segment 102b, e.g. less than approximately 1% of the vertical extent 112d of the second substrate segment 102b, e.g. less than approximately 0.1% of the vertical extent 112d of the second substrate segment 102b. By way of example, the other substrate segment 102b may include a substrate remainder or be formed therefrom (or at least from a part thereof).

By way of example, the vertical extent 102d of the first substrate segment 102a can be greater than approximately 10 nm (nanometers), e.g. greater than approximately 50 nm, e.g. greater than approximately 100 nm, e.g. greater than approximately 150 nm, e.g. greater than approximately 200 nm. Alternatively or additionally, the vertical extent 102d of the first substrate segment 102a can be less than approximately 1 μm (micrometer), e.g. less than approximately 660 nm. By way of example, the vertical extent 102d of the first substrate segment 102a can be more than 100 nm (e.g. less than approximately 1 μm), e.g. in a range of approximately 150 nm to approximately 660 nm, e.g. in a range of approximately 280 nm to approximately 660 nm, e.g. less than 330 nm, e.g. less than 200 nm.

A layer can be understood to be a sheetlike structure having a vertical extent 102d of less than approximately 10 μm, e.g. less than approximately 1 μm, e.g. less than approximately 0.1 μm, e.g. less than approximately 0.01 μm.

By way of example, the or each substrate segment 102a, 102b (divided from the substrate 102) can be in layer form, i.e. have a vertical extent 102d of less than approximately 10 μm, e.g. less than approximately 1 μm, e.g. less than approximately 0.1 μm, e.g. less than approximately 0.01 μm.

Substrate remainder can be understood to be a sheetlike structure having a vertical extent 102d of more than approximately 10 μm, e.g. more than approximately 100 μm, e.g. more than approximately 250 μm, e.g. more than approximately 500 μm. Additional substrate segments can optionally be divided from the substrate remainder by the latter being severed.

Optionally, the method may include, in 100c: forming an additional micromechanical structure including the second substrate segment 102b or at least the second partial region 104b thereof. The second substrate segment 102b can be divided from the substrate remainder beforehand by the latter being severed. Illustratively, the substrate 102b may include more than two substrate segments which can be successively separated from the substrate 102. Each of the substrate segments of the substrate 102 which is separated can be implemented in a micromechanical structure. Optionally, two substrate segments 102a, 102b can be implemented in the same micromechanical structure. By way of example, the first substrate segment 102a can provide the functional region of the micromechanical structure 106 and/or the second substrate segment 102b can provide an electrode of the micromechanical structure 106.

Forming the micromechanical structure can optionally include, in 100c: processing (e.g. structuring, thinning, doping) the first substrate segment 102a. In other words, a structure of the micromechanical structure 106 which is formed from the first substrate segment 102a may include the processed first substrate segment 102a.

Figure 2A:
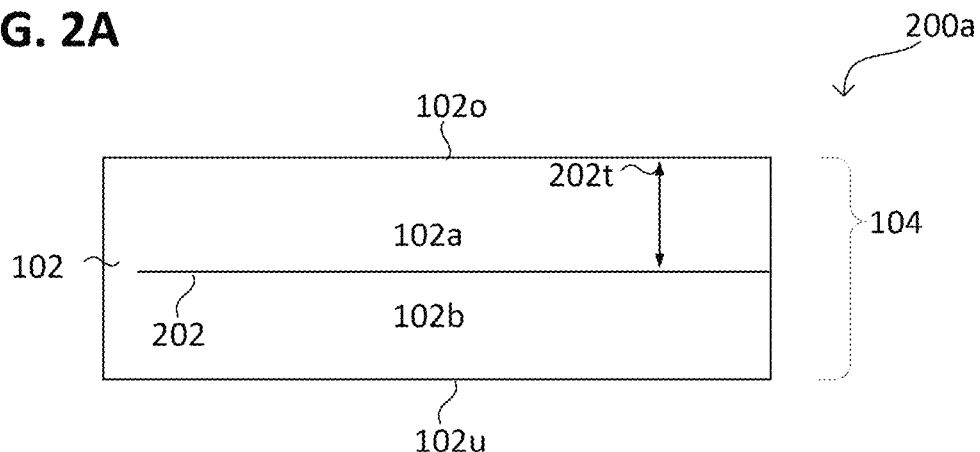
FIGS. 2A to 2C show in each case a micromechanical structure in a method in accordance with various embodiments.
Figure 2B:
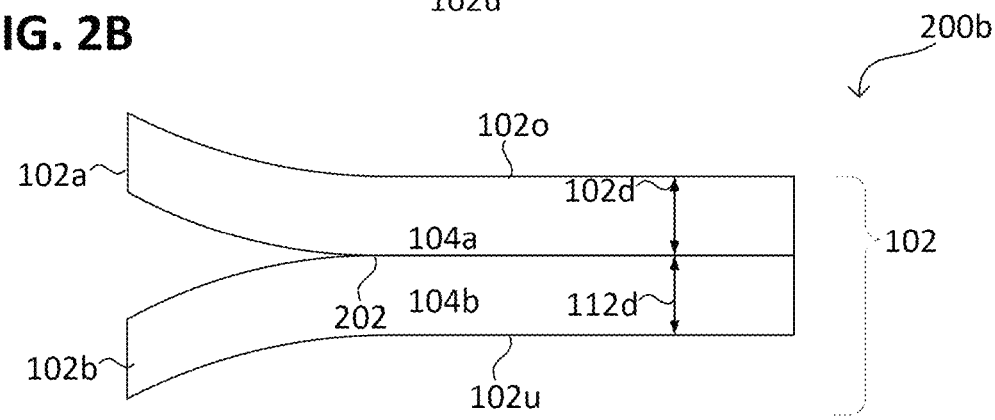
Figure 2C:
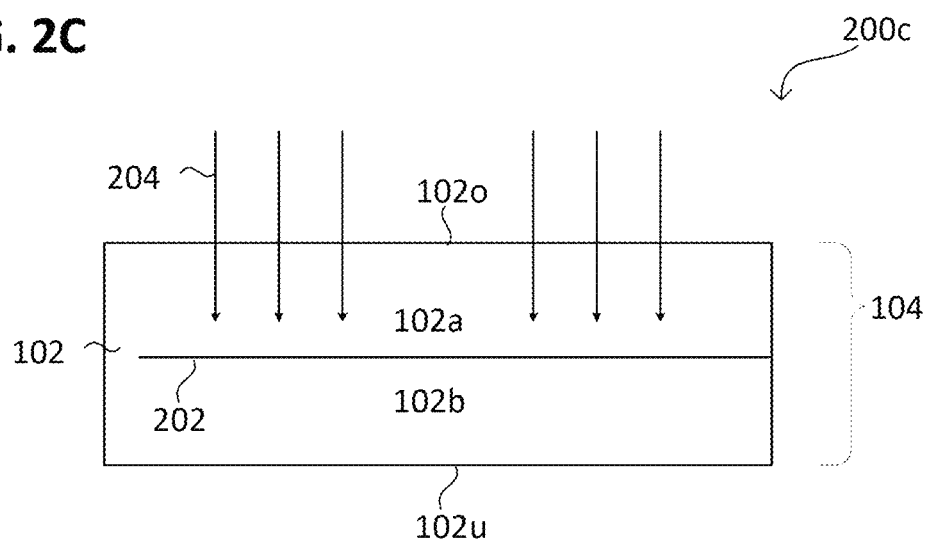

FIG. 2A, FIG. 2B and FIG. 2C illustrate in each case a method in accordance with various embodiments in a schematic side view or cross-sectional view (e.g. with the viewing direction along a main processing side 102o).

In 200a, the substrate may include a desired separating layer 202, by means of which the two substrate segments 102a, 102b are connected to one another. The desired separating layer 202 can be extended through the monocrystalline region 104, for example. The desired separating layer 202 may include the semiconductor material of the substrate 102 and include an impurity in a greater impurity concentration than the first and/or the second substrate segment 102a, 102b. Alternatively or additionally, the desired separating layer 202 may include a plurality of defects (e.g. lattice defects, pores or capillaries). The desired separating layer 202 can then have a greater defect density than the first and/or the second substrate segment 102a, 102b. By way of example, the desired separating layer 202 can have a greater porosity than the first and/or the second substrate segment 102a, 102b.

By way of example, providing 100a the substrate 102 may include, in 200a: forming the desired separating layer 202 by altering a chemical composition of the first substrate 102 between the two substrate segments 102a, 102b.

Furthermore, the method may include, in 200b: severing the substrate 102, wherein the severing is carried out by canceling a cohesion of the desired separating layer 202. Canceling the cohesion of the desired separating layer 202 can be carried out by means of (e.g. chemical, thermal or mechanical) processing of the substrate 102. By way of example, each substrate segment of the two substrate segments 102a, 102b can be more resistant (e.g. more temperature-resistant) to the processing than the desired separating layer 202. In other words, the desired separating layer 202 can have a greater resistance to the processing than each substrate segment of the two substrate segments 102a, 102b.

A greater resistance results in a slower alteration, e.g. no alteration. By way of example, a structure (e.g. a region or a layer) and/or a material can be altered by the processing to a lesser extent and/or more slowly the greater its resistance. The resistance can be related to a specific type of processing and/or deviate from one another for different types of processing.

The mechanically less resistant structure (e.g. region or layer) and/or the mechanically less resistant material can have for example a lower breaking strength, breaking force, tensile strength and/or mechanical hardness than the mechanically more resistant structure (e.g. region or layer) and/or the mechanically more resistant material. The chemically less resistant structure (e.g. region or layer) and/or the chemically less resistant material can have for example a greater chemical reactivity vis-à-vis a chemical processing agent than the chemically more resistant structure (e.g. region or layer) and/or the mechanically more resistant material.

A resistance can be reduced, for example, by a surface area being increased. Thus, for a chemically reactive etchant, for example, it is possible to provide a larger surface area that can be attacked by the etchant. Alternatively or additionally, a resistance can be increased by a mechanical hardness and/or breaking force being increased and/or a chemical reactivity vis-à-vis the etchant being reduced (also referred to as passivation). The chemical reactivity can describe the ability of a material to enter into a chemical reaction, e.g. the speed at which the chemical reaction takes place or the energy threshold necessary to initiate the reaction (also referred to as activation energy). By way of example, the chemical reaction can bring about a formation of pores.

In accordance with various embodiments, thermally stable in connection with a temperature can be understood to mean that a structure or a material can be loaded at least up to the temperature without losing its function and/or form. By way of example, the structure or the material at least up to the temperature can enter into no or hardly any chemical reactions with its surroundings and/or remain chemically stable. By way of example, the structure or the material at least up to the temperature can maintain its state of matter and/or its chemical composition. By way of example, the structure or the material at least up to the temperature can maintain its shape and/or its volume (i.e. without changing structurally). By way of example, the temperature up to which the structure or the material is thermally stable can be a temperature at which the state of matter of the structure or of the material changes, e.g. a melting point, or can be a transition temperature, e.g. a glass transition temperature.

In accordance with various embodiments, the severing may include subtractive processing, such as dividing, eroding or machining, for example.

Eroding can be understood as a group of (thermal and/or chemical) processing processes which belong to the main group of separation. This group of processing processes, in contrast to machining or dividing, can separate individual workpiece layers or parts in a non-mechanical way. Eroding may include for example: thermal eroding (e.g. laser beam processing, plasma etching), chemical eroding (e.g. etching), electrochemical eroding (e.g. electroeroding). The severing can be carried out for example by eroding the desired separating layer 202, e.g. by means of thermal eroding (e.g. laser beam processing, plasma etching), chemical eroding (e.g. etching), waterjet cutting and/or electrochemical eroding (e.g. electrode eroding). The severing can be carried out for example by at least partly removing the desired separating layer 202 by means of an etchant. A connection of the two substrate segments 102a, 102b can thus be released.

Dividing may include separating the substrate 102 into a plurality of parts, e.g. without swarf formation, e.g. by means of cracking, by means of breaking and/or by means of cutting. The severing can be carried out for example by dividing the substrate 102, e.g. by cracking or breaking the substrate 102 in the desired separating layer. By way of example, a mechanical force (e.g. a tensile force) can be transmitted to the desired separating layer, which force exceeds the breaking force of the desired separating layer.

By way of example, forming the desired separating layer 202 may include, in 200a: altering a chemical composition between the two substrate segments 102a, 102b. In other words, a boundary layer 202 (also referred to as interface 202) between the two substrate segments 102a, 102b can be chemically altered. By way of example, by means of the altering, it is possible to reduce a resistance of the substrate 102 in the altered boundary layer 202 between the two substrate segments 102a, 102b vis-à-vis the severing.

By way of example, forming the desired separating layer 200 may include, in 200c: altering a chemical composition between the two substrate segments 102a, 102b by means of an ion implantation 204 (also referred to as doping of the boundary layer 202). Optionally, the method may include, in 200c: altering a chemical composition of the first substrate segment 102a by means of ion implantation 204 (also referred to as doping of the first substrate segment 102a). In other words, by means of a first ion implantation 204 it is possible to form the desired separating layer 202 between the two substrate segments 102a, 102b and by means of an optional second ion implantation 204 it is possible to alter the first substrate segment 102a. Optionally, the first ion implantation 204 and the second ion implantation 204 can differ, e.g. in at least the implanted material and/or the implantation depth of the implantation energy.

By means of the ion implantation 204, an impurity (e.g. a chemical element) in the form of ions of the impurity can be introduced into the substrate 102 and/or the first substrate segment 102a. By way of example, it is possible to increase a concentration (also referred to as impurity concentration) of the impurity in the altered section, e.g. in the boundary layer 202 and/or in the first substrate segment 102a. Optionally, a reaction of the impurity with the semiconductor material of the boundary layer 202 can be excited, e.g. by means of a thermal treatment.

By way of example, by means of the ion implantation 204 it is possible to form (e.g. increase) an impurity concentration (i.e. a number of atoms of the impurity) in the boundary layer 202 or in the first substrate segment 102a, for example of more than in the second substrate segment 102b and/or of more than approximately $10^{15}$ atoms per cubic centimeter (atoms/cm$^3$), e.g. of more than approximately $10^{16}$ atoms/cm$^3$, e.g. of more than approximately $10^{17}$ atoms/cm$^3$, e.g. of more than approximately $10^{18}$ atoms/cm$^3$, e.g. of up to approximately $10^{19}$ atoms/cm$^3$. The ion implantation 204 can make it possible to provide the position and/or thickness of the desired separating layer 202 with an illustratively least possible deviation from the stipulation.

Altering the chemical composition of the boundary layer 202 between the first substrate segment 102a and the second substrate segment 102b may include altering a mechanical characteristic of the boundary layer 202, e.g. reducing its mechanical breaking strength and/or increasing its porosity.

By way of example, by means of the first ion implantation 204, at least hydrogen can be introduced into the boundary layer 202. In other words, the impurity (also referred to as second impurity) introduced into the boundary layer may include or be formed from at least hydrogen. In other words, the second impurity may include or be formed from hydrogen. Optionally, hydrogenation can be carried out, i.e. the addition of hydrogen to the chemical element or chemical elements or the compound thereof of which the boundary layer 202 is composed.

Alternatively or additionally, defects (e.g. lattice defects, pores or capillaries) can be formed in the boundary layer 202, e.g. by means of a structural alteration of the boundary layer 202. After the altering, the boundary layer 202 can have a greater defect density than the first and/or second substrate segment 102a, 102b. By way of example, the desired separating layer 202 can have a greater porosity than the first and/or second substrate segment 102a, 102b. The defect density can denote the number of defects (e.g. pores) per volume, i.e. a spatial density. The defects can be produced artificially in order to set the resistance. The defects can reduce the mechanical resistance vis-à-vis the severing.

Altering the chemical composition of the first substrate segment 102a may include altering, e.g. reducing, a mechanical characteristic (e.g. mechanical hardness, modulus of elasticity and/or mechanical stiffness) and/or electrical characteristic (e.g. electrical conductivity or electrical resistance) of the first substrate segment 102a. By way of example, the mechanical properties of the functional structure formed later or the electrical properties of an electrode formed therefrom later can thus be adapted to predefined requirements. By way of example, by means of the optional second ion implantation 204, at least nitrogen and/or phosphorus can be introduced into the first substrate segment 102a. In other words, the impurity (also referred to as second impurity) introduced into the first substrate segment 102a may include or be formed from at least nitrogen and/or phosphorus.

Illustratively, the first ion implantation 204 can be carried out through the first monocrystalline substrate segment 102a. Alternatively or additionally, the second ion implantation 204 can be carried out into the first monocrystalline substrate segment 102a.

Figure 3A:
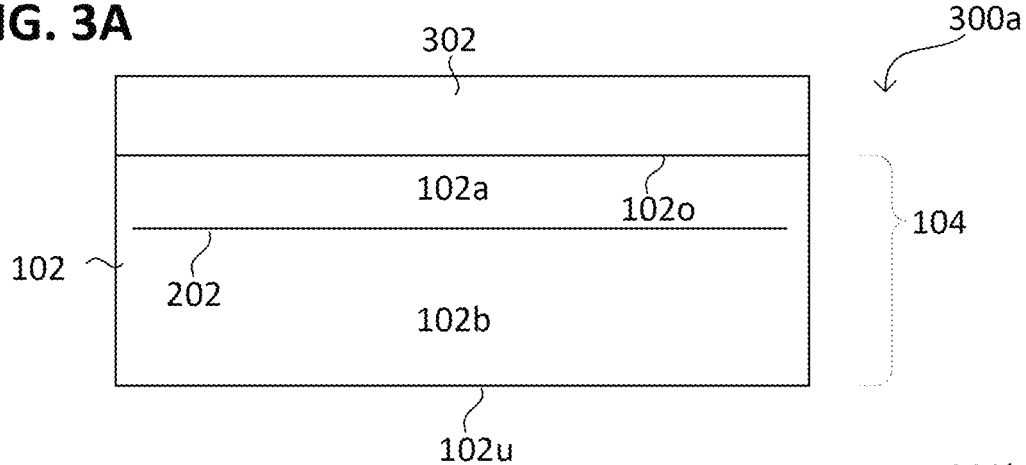
FIGS. 3A to 3C show in each case a micromechanical structure in a method in accordance with various embodiments.
Figure 3B:
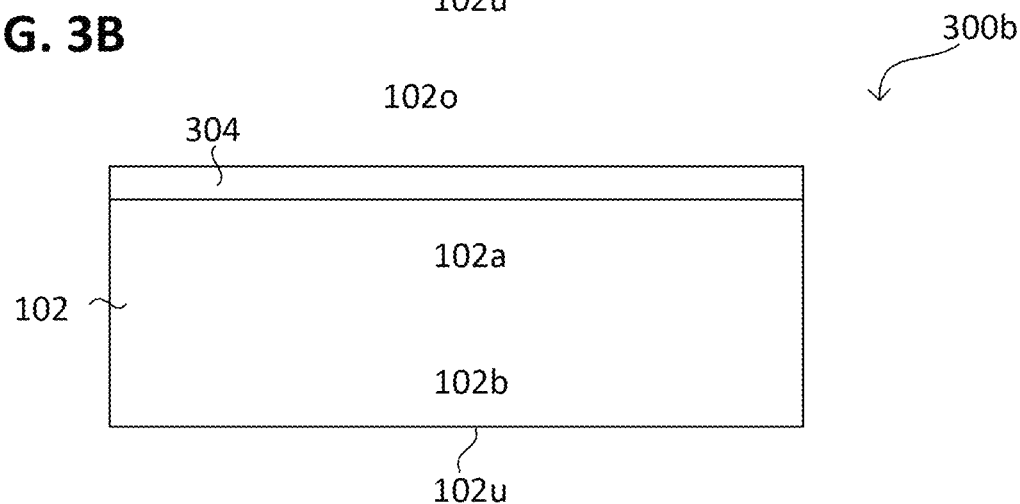
Figure 3C:
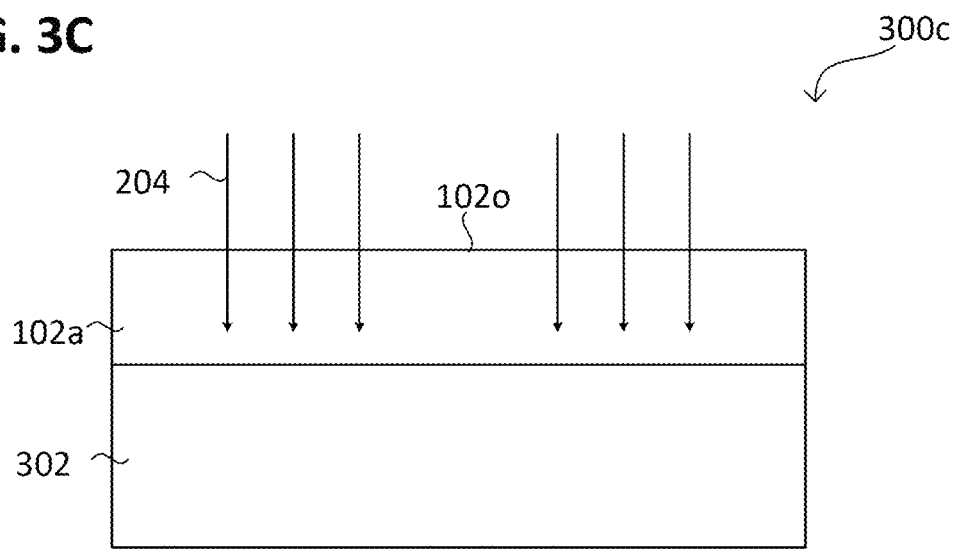
Figure 5A:
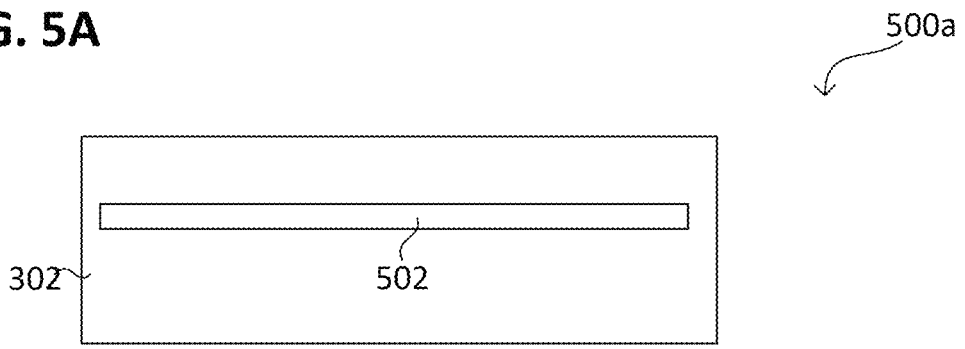
FIGS. 5A to 5D show in each case a micromechanical structure in a method in accordance with various embodiments.
Figure 5B:
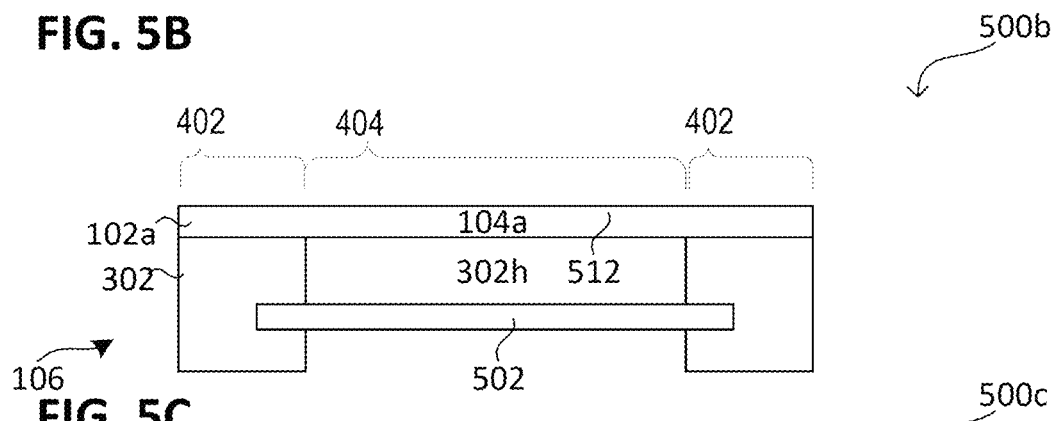
Figure 5C:
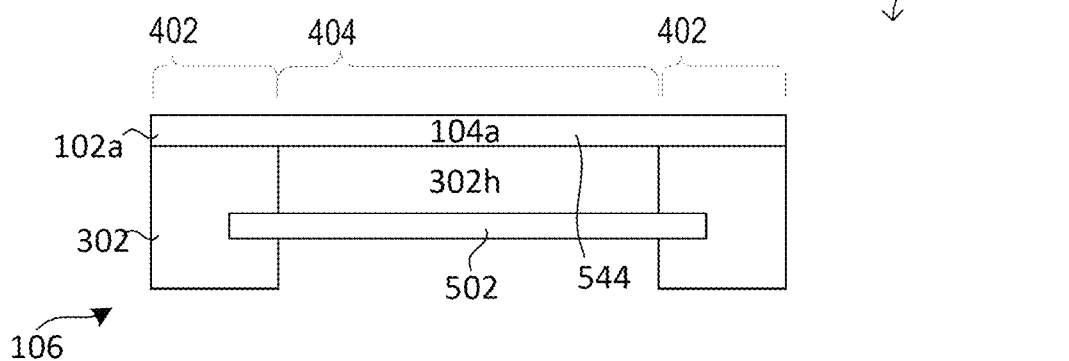
Figure 5D:
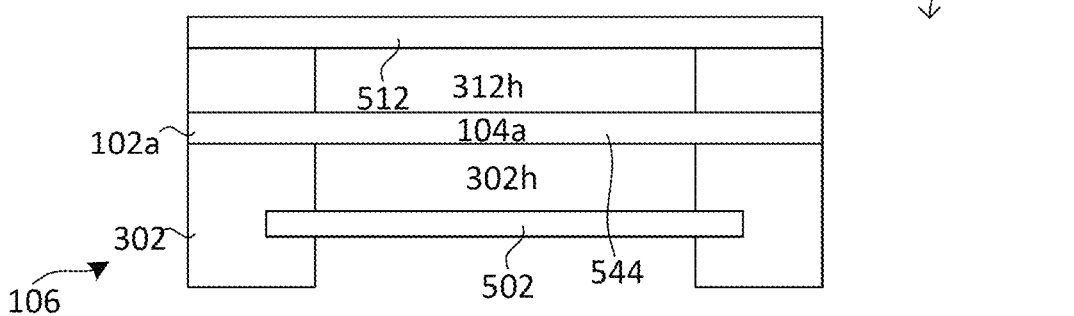

FIG. 3A, FIG. 3B and FIG. 3C illustrate in each case a method in accordance with various embodiments in a schematic side view or cross-sectional view.

The method may include, in 300a: securing the substrate 102 (also referred to as first substrate 102), e.g. by the first main processing side 102o, on an additional substrate 302 (also referred to as second substrate 302) before the severing. By way of example, the first substrate segment 102a can be secured on the second substrate 302.

The second substrate 302 can differ from the first substrate 102, in at least one chemical composition and/or in at least one crystallization type. By way of example, the first substrate can have a higher melting point than the second substrate 302 and/or of more than 900° C. Alternatively or additionally, the second substrate 302 may include or be formed from a semiconductor material (e.g. Si), an insulator (i.e. an electrically insulating material, such as e.g. SiO$_2$), a ceramic, a metal (e.g. tungsten or molybdenum).

Securing may include for example, in 300a, connecting the first substrate 102 and the second substrate 302 to one another, e.g. by means of an adhesive, by means of bonding (e.g. by means of hydrophilic bonding, anodic bonding and/or thermal bonding) and/or by means of laser beam welding. Bonding and/or laser beam welding can form a nonreleasable connection. Welding can be carried out by means of local supply of heat, e.g. until local melting of the first substrate 102 and/or of the second substrate 302, and can optionally include exerting an additional force action (pressure) thereon, which presses the first substrate 102 and the second substrate 302 against one another. Bonding can be carried out by means of a chemical reaction of the first substrate 102 and/or of the second substrate 302 with one another, which is initiated at a temperature below their melting point. Optionally, the first substrate 102 and/or the second substrate 302 can be heated, e.g. to a temperature in a range of approximately 100° C. to approximately 700° C.

Securing can be carried out by means of cohesive connection, for example, in 300a. The cohesive connection can be understood as a connection in which the connection partners are held together by atomic or molecular forces. The cohesive connection can be a nonreleasable connection (also referred to as irreversible connection), that is to say that it can be canceled only by destruction of the connection partners. The cohesive connection may include: bonding, welding and/or adhesive bonding. By way of example, a nonreleasable connection can be formed by means of chemisorption. In accordance with various embodiments, the nonreleasable cohesive connection may include or be formed from an atomic-cohesive connection, i.e. can be held together by means of atomic forces (e.g. by means of chemical bonds between the connection partners), e.g. by means of strong atomic forces (such as in the case of chemisorption, for example).

By way of example, connecting the first substrate 102 and the second substrate 302 to one another can be carried out by means of an (e.g. hydrophilic) adhesion layer 304, as described in detail with reference to 300b. The adhesion layer 304 can be arranged between the first substrate 102 and the second substrate 302.

By way of example, a force (also referred to as adhesion force) by which the first substrate 102 and the second substrate 302 are secured on one another, e.g. connected to one another, can be greater than a breaking force of the desired separating layer 202. By way of example, the connection (e.g. the adhesion layer 304) between the two substrates 102, 302 can impart a force between them which is greater than their breaking force or the breaking force of the desired separating layer 202. Relative to the area of the connection, the breaking force can correspond to the tensile strength (in force per area). Illustratively, a nonreleasable connection can be provided which imparts between the two substrates 102, 302 a force which is greater than their breaking force. The breaking force can be understood to mean force required to break or crack the component.

In other words, the connection between the first substrate 102 and the second substrate 302 can have a greater resistance to the severing than the desired separating layer 202.

Securing the first substrate 102 on the second substrate 302 and subsequently severing the first substrate 102 can also be referred to as transferring the first substrate segment 102a.

Furthermore, the method may include, in 300a, severing the substrate 102, wherein the first substrate segment 102a is or remains secured on the second substrate 302.

In 300b, the substrate 102 may include an adhesion layer 304. By way of example, providing the substrate 102, may include, in 300b: forming the adhesion layer 304 on the first main processing side 102o. The adhesion layer 304 can be formed for example above (e.g. in physical contact with) the first substrate segment 102a, e.g. by an (e.g. hydrophilic) material (also referred to as adhesion material) from which the adhesion layer 304 is intended to be formed being arranged above the first substrate segment 102a. Arranging the (e.g. dielectric) adhesion material can be carried out by means of a coating process, e.g. by means of chemical vapor deposition (CVD) or physical vapor deposition (PVD). The adhesion material may include or be formed from an oxide and/or a dielectric, e.g. a semiconductor oxide, e.g. silicon oxide.

Alternatively, in order to form the adhesion layer 304, a part of the substrate 102 on the first main processing side 102o can be chemically altered, e.g. converted (e.g. oxidized), wherein the adhesion layer 304 is formed from the chemically altered material of the substrate 102 (e.g. an oxide).

By way of example, the adhesion layer 304 may include or be formed from an oxide (e.g. of the semiconductor material of the substrate 102), e.g. a semiconductor oxide such as silicon oxide ($SiO_{2-x}$, where $2 > x \geq 0$).

By way of example, securing, in 300a, can be carried out by means of the adhesion layer 304, e.g. by heating the adhesion layer. To that end, the adhesion layer 304 can be brought into physical contact with the additional substrate. By way of example, the adhesion layer 304 can be in physical contact with the first substrate segment 102a.

Optionally, the method may include, in 300b: altering a chemical composition of the first substrate segment 102a, which is secured on the second substrate 302, by means of the second ion implantation 204 (also referred to as doping of the first substrate segment 102a). The second ion implantation 204 can be configured as in 200c.

FIG. 4A, FIG. 4B and FIG. 4C illustrate in each case a method in accordance with various embodiments in a schematic side view or cross-sectional view (e.g. with the viewing direction along a main processing side 102o).

Forming the micromechanical structure 106 may include, in 400a: exposing (e.g. mechanically exposing) at least one section 404 (also referred to as freely suspended section 404) of the first substrate piece 102a, e.g. by removing a part of the second substrate 302 and/or by removing a remaining residue of the adhesion layer 304, e.g. in each case on mutually opposite sides. Exposing may include forming an opening 302o, e.g. a through opening 302o (i.e. an opening 302o extending through the substrate), in the second substrate 302. The opening 302o can for example include or be formed from a cavity of the second substrate 302.

By way of example, the micromechanical structure 106 may include an electrode having the substrate piece 102a, as will be described in even greater detail below. Alternatively or additionally, the micromechanical structure 106 may include a membrane including the substrate piece 102a, as will be described in even greater detail below.

The micromechanical structure 106, e.g. its first substrate piece 102a, may include a first section 402 (also referred to as suspension section 402 or securing section 402) and a second section 404 (also referred to as freely suspended section 404) (e.g. adjoining the latter). The freely suspended section 404 can be secured (e.g. suspended) on the second substrate 302 by means of the securing section 402.

The freely suspended section 404 can be exposed for example on mutually opposite sides (e.g. on the side facing the second substrate 302 and the side correspondingly facing away from the latter).

The freely suspended section 404 may include or be formed from a section of the first substrate piece 102a (e.g. the monocrystalline partial region 104a thereof). Alternatively or additionally, the securing section 402 may include or be formed from a section of the first substrate piece 102a (the monocrystalline partial region 104a thereof). By way of example, the first substrate piece 102a (e.g. the monocrystalline partial region 104a thereof) can extend from the suspension of the micromechanical structure 106 right into the freely suspended part of the micromechanical structure 106.

By way of example, the freely suspended section 404 and the securing section 402 can be connected to one another monolithically (e.g. in a monocrystalline fashion).

By way of example, the freely suspended section 404 (e.g. in the case of a membrane 408) can have a thickness 404d of less than approximately 1 µm (micrometer), e.g. less than approximately 660 nm, and/or of more than 10 nm (e.g. greater than approximately 50 nm, e.g. greater than approximately 100 nm, e.g. greater than approximately 150 nm, e.g. greater than approximately 200 nm), e.g. in a range of approximately 150 nm to approximately 660 nm.

By way of example, the freely suspended section 404 (e.g. in the case of a cantilever 410) can have a thickness 404d of less than approximately 5 µm (e.g. less than approximately 3 µm, e.g. less than approximately 1 µm, e.g. less than approximately 0.5 µm) and/or of more than 10 nm (e.g. greater than approximately 50 nm, e.g. greater than approximately 100 nm, e.g. greater than approximately 150 nm, e.g. greater than approximately 200 nm), e.g. in a range of approximately 2 µm to approximately 4 µm, e.g. approximately 3 µm.

Forming the micromechanical structure 106 can optionally include, in 400a: thinning and/or planarizing the first substrate segment 102a or at least the first partial region 104a.

Forming the micromechanical structure 106 may include, in 400b: forming a membrane 408, which includes or is formed from the first substrate segment 102a or at least the first partial region 104a. The membrane 408 can be configured to be deflected in a central region (also referred to as functional region) of the freely suspended section 404, which is arranged e.g. at a distance from the second substrate 302, e.g. above the opening 302o. During deflection, a peripheral region of the freely suspended section 404 (arranged on or near the second substrate 302) of the membrane 408 can be fixedly held (e.g. in an immobile fashion) by means of the securing section 402 (also referred to as support or clamp).

The membrane 408 can be understood to be a sheetlike structure element, such as a plate, which is anchored on one or more peripheral regions by means of a securing section 402 (for example arranged peripherally and/or surrounding the central region). If the membrane 408 is subjected to a mechanical loading, it diverts the load to the securing section 402, on which it is fixed counter to a shear stress. The membrane 408 can be carried by means of the second substrate 302.

Forming the micromechanical structure 106 may include, in 400c: forming a cantilever 410 (e.g. a cantilever beam), which includes or is formed from the first substrate segment 102a or at least the first partial region 104a. The cantilever 410 can be configured to be deflected in a first end region 410e (also referred to as functional region) of the freely suspended section 404 (at a distance from the second substrate 302), while the second end region 420e (opposite the latter) of the freely suspended section 404 (on or near the second substrate 302) is fixedly held (e.g. in an immobile fashion) by means of the securing section 402. The end region 410e of the freely suspended section 404 can be separated from the second substrate 302 by means of a gap (opposite the peripheral region), e.g. in a deflectable fashion.

The cantilever 410 can be understood to be a longitudinally extending structure element, such as an elongate plate or a beam, which is anchored on a second end region 420e (for example opposite the first end region) by means of a securing section 402. In other words, the cantilever 410 may include a projecting first end region 410e mounted on one side. If the cantilever 410 is subjected to a mechanical loading, it diverts the load to the securing section 402, on which it is fixed counter to a shear stress. The cantilever 410 can be carried by means of the second substrate 302.

Forming the micromechanical structure 106 may include, in 400a, in 400b and/or in 400c: forming an additional layer 412 (also referred to as base layer 412) above the first substrate segment 102a (e.g. above the first section 402 and/or above the second section 404), e.g. by means of PVD or CVD. The base layer 412 and the first substrate segment 102a can differ from one another, e.g. in their semiconductor material and/or in their crystallization type. The base layer 412 can be polycrystalline and/or include or be formed from Si.

By way of example, after the severing of the substrate 102, and optional planarization and structuring of the first substrate segment 102a (e.g. including or formed from an SiC layer), a deposition of poly-Si (polycrystalline silicon) can be carried out, which subsequently serves as a functional membrane 408 or cantilever 410. By way of example, the first substrate segment 102a (e.g. including or formed from SiC) can provide a supporting/stabilizing structure (also referred to as stiffening structure) in order to increase the robustness of the poly-Si membrane. Optionally, the first substrate segment 102a can be structured.

In general, the micromechanical structure 106 may include a functional structure 544, e.g. the membrane 408 and/or the cantilever 410. The functional structure 544 may include the anchored section 402 and the cantilevered section 404, which can be (e.g. monolithically) monocrystalline and/or can be formed by means of processing of the monocrystalline substrate piece 102a.

FIG. 5A, FIG. 5B, FIG. 5C and FIG. 5D illustrate in each case a method in accordance with various embodiments in a schematic side view or cross-sectional view (e.g. with the viewing direction along a main processing side 102o).

Forming the micromechanical structure 106 may include, in 500a: providing the second substrate 302, which has an electrode 502. The electrode 502 (also referred to as first electrode 502) can be formed before the first substrate 102 and the second substrate 302 are secured on one another (also referred to as preprocessing of the second substrate 302).

The first electrode 502 can have for example a thickness (vertical extent) of less than approximately 2 μm, e.g. less than approximately 1 μm, e.g. greater than or equal to approximately 600 nm, e.g. if the first electrode 502 includes or is formed from a polycrystalline material (e.g. polysilicon or nitride).

If the first electrode 502 is formed from a substrate segment (as will be described below), e.g. from monocrystalline material (e.g. SiC), the first electrode 502 can be made thinner, e.g. having a thickness (vertical extent) of less than approximately 600 nm, e.g. less than approximately 300 nm, e.g. less than or equal to approximately 150 nm, e.g. greater than or equal to approximately 100 nm.

Forming the micromechanical structure 106 may include, in 500b: forming an additional electrode 512 (also referred to as second electrode 512), which includes or is formed from the first substrate segment 102a or at least the first partial region 104a. The second electrode 512 can have for example a smaller thickness (vertical extent) than the first electrode 502 (e.g. if the second electrode 512 includes more monocrystalline material than the first electrode 502).

In general, the micromechanical structure 106 may include an electronic component 502, 512 (also referred to as micromechanical structure 106), e.g. the first electrode 502 and/or the second electrode 512. Analogously to the functional structure 544, the electronic (active) structure element 502, 512 may include an anchored section 402 and the cantilevered section 404, which can be (e.g. monolithically) monocrystalline and/or can be formed by means of processing of the monocrystalline substrate piece 102a. The electronic structure element 502, 512 can have a greater stiffness than the functional structure 544. The stiffness can be understood as resistance of a structure to elastic deformation as a result of a force or a torque (bending moment or torsional moment, depending on stress). The electronic (active) structure element 502, 512 can transmit an electrical signal during operation of the micromechanical structure 106.

Forming the second electrode 512 may include: forming a cavity 302h (also referred to as first cavity 302h) between the substrate segment 102a and the first electrode 502, e.g. by removing a material (e.g. a sacrificial material) between the substrate segment 102a and the first electrode 502.

Forming the cavity 302h can be carried out for example after arranging the first substrate segment 102a and/or forming the first electrode 502. By way of example, a sacrificial layer can be arranged between the first electrode 502 and the first substrate segment 102a, said sacrificial layer being removed in order to form the cavity 302h, e.g. by means of the sacrificial layer being etched free/out. Alternatively or additionally, the sacrificial layer can serve for exactly setting the vertical distances between membrane and electrode(s).

Alternatively, the cavity 302h can be formed before the first substrate segment 102a is arranged above the first electrode 502, i.e. illustratively in a floating fashion (above the cavity 302h).

The second electrode 512 can have for example a thickness (vertical extent) smaller than the first electrode 502 and/or of less than 600 nm, e.g. less than or equal to approximately 300 nm, e.g. less than or equal to approximately 150 nm, e.g. in a range of approximately 100 nm to approximately 400 nm. By way of example, the second electrode 512, using the monocrystalline material (e.g. SiC), can be made thinner than the first electrode 502 (which can have a thickness for example in a range of approximately 610 nm to approximately 2000 nm).

The first substrate segment 102a or its first partial region 104a can spatially straddle the cavity 302h.

Forming the micromechanical structure 106 may include, in 500c: forming a functional structure 544 (e.g. providing a membrane 408 or a cantilever 410) including the first substrate segment 102a or at least the first partial region 104a. Forming the functional structure 544 may include: forming a first cavity 302h between the substrate segment 102a and the first electrode. The functional structure 544 can have a functional region, which is deflectable relative to the second substrate 302 (e.g. into the first cavity 302h) as a reaction to a force acting thereon. The first substrate segment 102a or its first partial region 104a can spatially straddle the first cavity 302h.

Forming the micromechanical structure 106 may include, in 500d: forming the second electrode 512, wherein the functional structure 544 is arranged between the second electrode 512 and the first electrode 502. The functional structure 544 may include the first substrate segment 102a or at least the first partial region 104a or can be formed thereon (or at least from a part thereof). Forming the functional structure 544 may include: forming a first cavity 302h between the substrate segment 102a and the first electrode 502 and/or forming a second cavity 312h between the substrate segment 102a and the second electrode 512.

Forming the second cavity 312h can be carried out for example after arranging the first substrate segment 102a and/or forming the first electrode 502 and/or the second electrode 512. By way of example, a sacrificial layer can be arranged between the second electrode 512 and the first substrate segment 102a, said sacrificial layer being removed in order to form the second cavity 312h, e.g. by means of the sacrificial layer being etched free/out. Alternatively or additionally, the sacrificial layer can serve for exactly setting the vertical distances between membrane and electrode(s).

Alternatively, the second cavity 312h can be formed before the second electrode 512 is arranged above the first substrate segment 102a, i.e. illustratively in a floating fashion (above the second cavity 312h).

Alternatively, the substrate segment 102a can be used for forming the second electrode 512.

The first substrate segment 102a or its first partial region 104a can spatially straddle the first cavity 302h and/or the second cavity 312h.

The substrate segment 102a arranged between the two electrodes 502, 512 can provide for example the membrane 408 or the cantilever 410. Optionally, a second substrate segment 102b can be used for forming the second electrode 512, as will be described in even greater detail below.

Figure 6A:
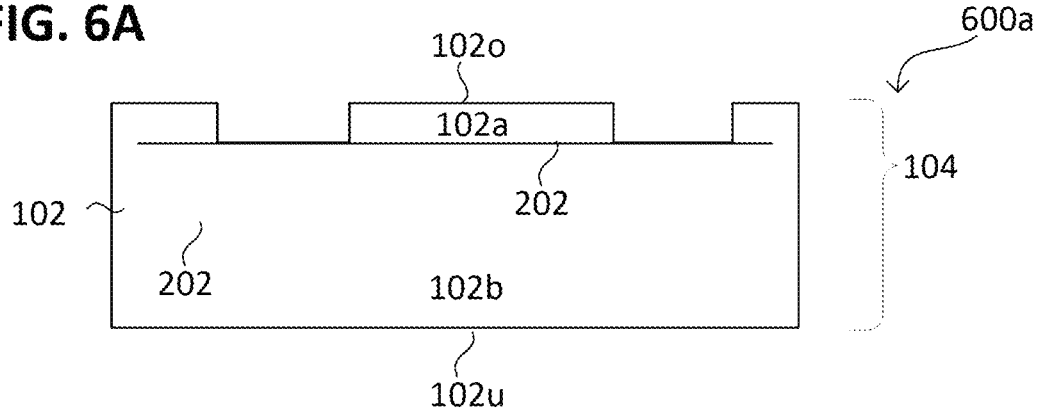
FIGS. 6A to 6C show in each case a micromechanical structure in a method in accordance with various embodiments.
Figure 6B:
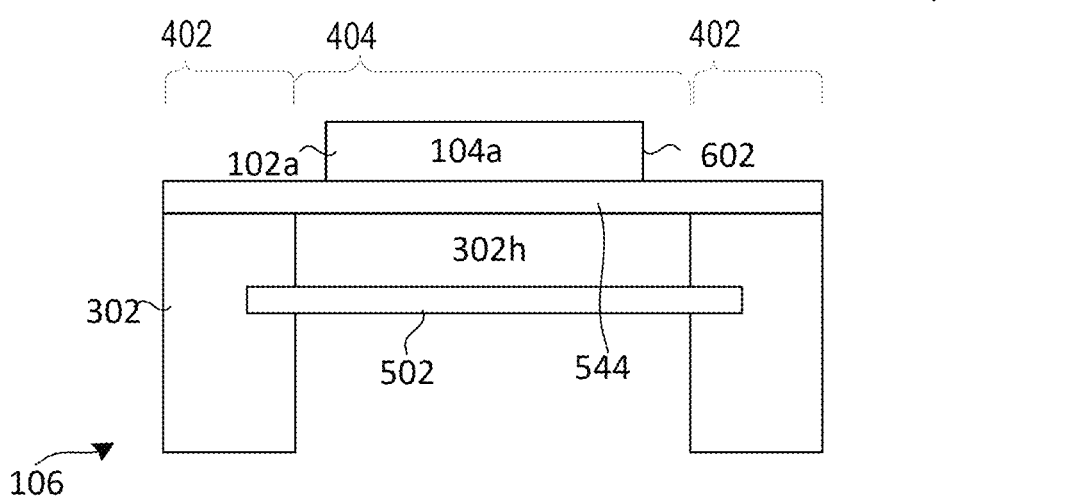
Figure 6C:
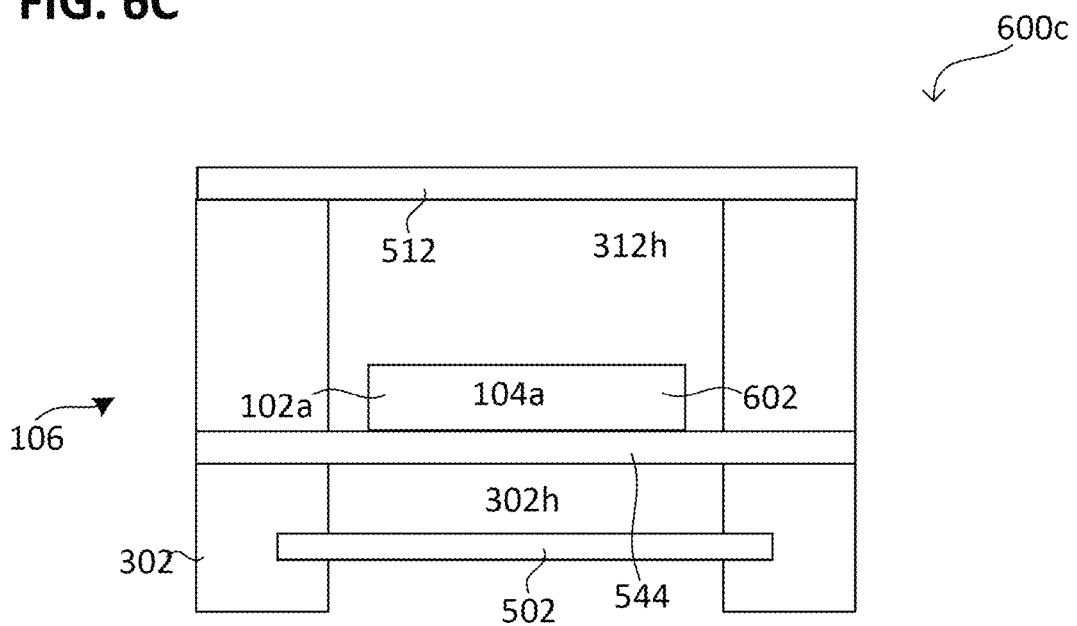

FIG. 6A, FIG. 6B and FIG. 6C illustrate in each case a method in accordance with various embodiments in a schematic side view or cross-sectional view (e.g. with the viewing direction along a main processing side 102o)

Providing the substrate 102 may include, in 600a: structuring the first substrate segment 102a (and optionally the adhesion layer 304), e.g. after forming the desired separating layer 202. By way of example, structuring the first substrate segment 102a may include exposing at least one or a plurality of regions of the desired separating layer 202. Alternatively or additionally, structuring the first substrate segment 102a may include forming one or a plurality of openings in the substrate segment 102a which for example penetrate through the substrate segment 102a.

Structuring the first substrate segment 102a can be carried out by means of etching, e.g. by means of wet-chemical etching, dry etching (e.g. plasma etching or sputter etching) and/or by means of ion etching. Alternatively or additionally, structuring the first substrate segment 102a can be carried out by means of a mask (e.g. the mask formed by means of photolithography process). The photolithography process may include for example: applying a hard mask (e.g. including or formed from photoresist) over the first substrate segment 102a; and structuring the first substrate segment 102a by means of etching the first substrate segment 102a. Alternatively, a maskless structuring process can be used, e.g. a laser structuring process (e.g. a CNC laser process, i.e. a computer-aided numerically controlled laser process).

Forming the micromechanical structure 106 may include, in 600b: forming a stiffening structure 602 (e.g. including struts, strips or rings), which includes or is formed from the (e.g. structured) first substrate segment 102a or at least the first partial region 104a. The stiffening structure 602 can be arranged above a deflectable region (e.g. the freely suspended section), e.g. above a membrane 408 or a cantilever 410. By way of example, the second substrate 302 may include a functional structure 544 before it is connected to the first substrate 102. Alternatively, the deflectable region can be deposited on or above the stiffening structure 602, e.g. including or formed from polycrystalline silicon (also referred to as poly-Si).

In accordance with various embodiments, the deflectable region can be arranged between the stiffening structure 602 and the cavity 302h. Alternatively or additionally, the or an additional stiffening structure 602 can be arranged between the cavity 302h and the deflectable region, e.g. in a manner adjoining the cavity 302h.

Alternatively, the deflectable region (e.g. a membrane 408 or a cantilever 410) may include or be formed from the monocrystalline semiconductor material and the stiffening structure 602 may include or be formed from a polycrystalline semiconductor material, e.g. poly-Si. By way of example, the stiffening structure 602 can be deposited on or above the deflectable region, e.g. including or formed from polycrystalline silicon (also referred to as poly-Si).

The stiffening structure 602 can have a greater mechanical hardness, a greater stiffness or a greater modulus of elasticity than the functional structure 544. The stiffness of the stiffening structure 602 can be altered by means of the structuring of the first substrate segment 102a. Structuring the first substrate segment 102a can be carried out before or after arranging above the deflectable structure 408, 410.

Forming the micromechanical structure 106 may include, in 600c: forming a stiffening structure 602, which includes or is formed from the (e.g. structured) first substrate segment 102a or at least the first partial region 104a, between the first electrode 502 and the second electrode 512. The stiffening structure 602 can be arranged above a functional structure, e.g. above a membrane 408 or a cantilever 410.

Figure 7A:
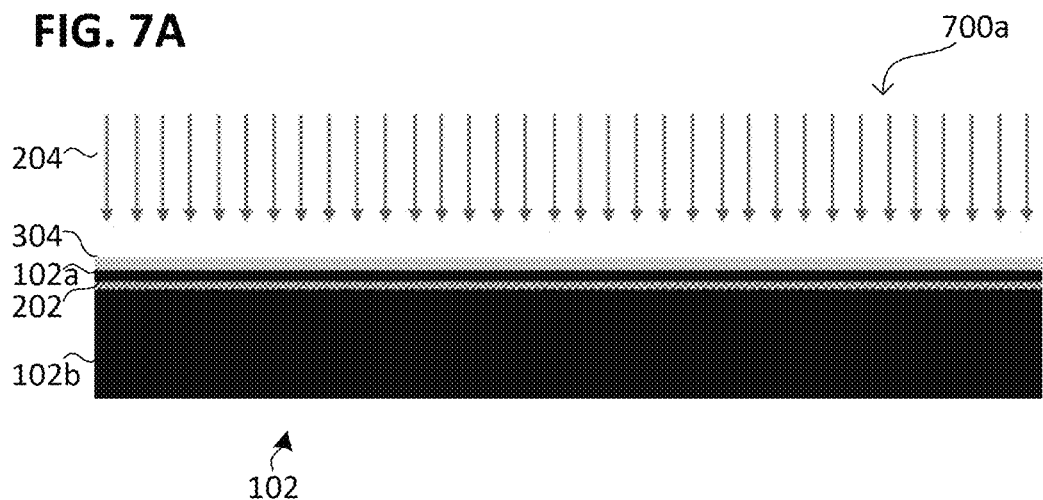
FIGS. 7A and 7B show in each case a micromechanical structure in a method in accordance with various embodiments.
Figure 7B:
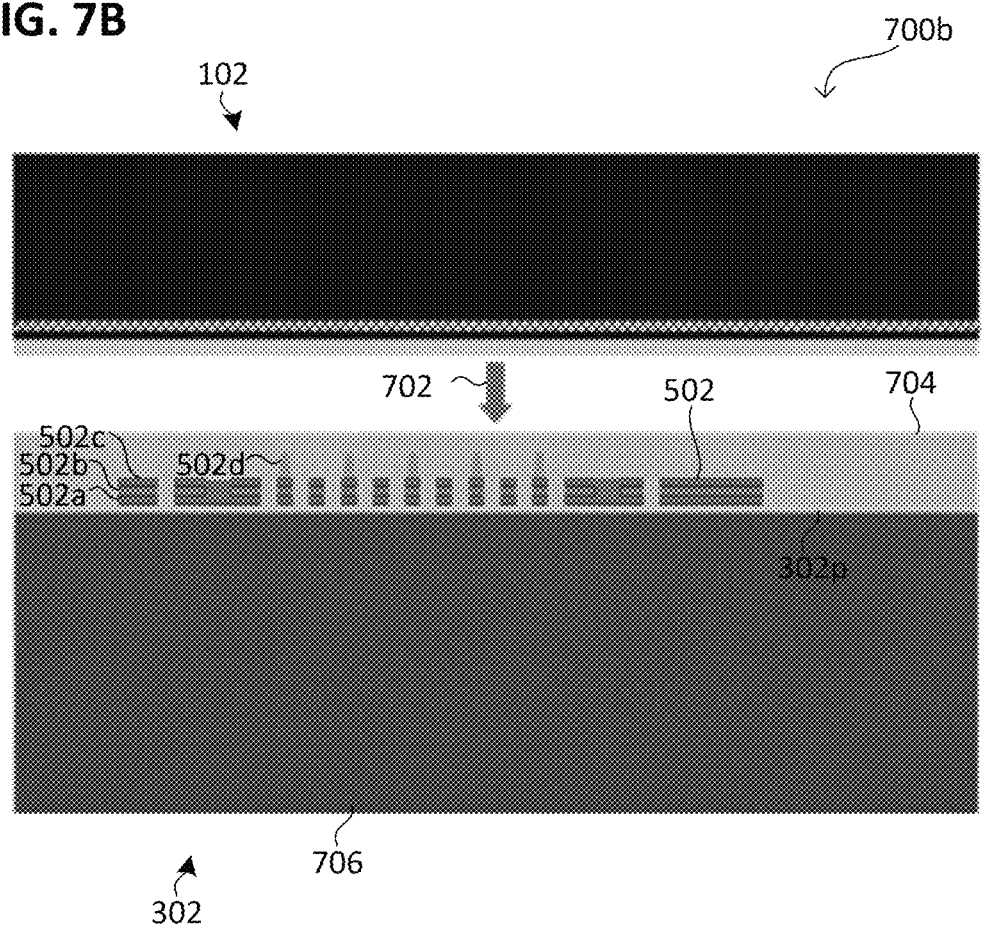

FIG. 7A and FIG. 7B illustrate in each case a method in accordance with various embodiments in a schematic side view or cross-sectional view (e.g. with the viewing direction along a main processing side 102o).

Providing the substrate 102 may include, in 700a: forming the desired separating layer 202 by means of ion implantation 204 through the first substrate segment 102a and through the adhesion layer 304. Alternatively or additionally, the method may include, in 700a: altering a chemical composition of the first substrate segment 102a by means of ion implantation 204, e.g. the second ion implantation 204. Optionally, the first ion implantation 204 can be carried out beforehand (e.g. for forming the separating layer 202). Alternatively or additionally, the first ion implantation 204 and the second ion implantation 204 can differ, e.g. in at least the implanted material and/or the implantation depth of the implantation energy.

Optionally, the method may include, in 700a: structuring the first substrate segment 102a. The material properties of a stiffening structure formed therefore later, if appropriate, can thus be adapted.

The (e.g. hydrophilic) adhesion layer 304 can for example include or be formed from an (e.g. hydrophilic) dielectric, e.g. an oxide (also referred to as oxide layer 304), e.g. a semiconductor oxide.

By way of example, the substrate 102 can be a monocrystalline silicon carbide substrate 102 (SiC substrate 102) or include at least one SiC single-crystal region 104.

By way of example, the desired separating layer 202 can be formed by means of implantation 204 of hydrogen ions (e.g. using hydrogen gas—$H_2$).

Securing the first substrate 102 (also referred to as carrier substrate) on the second substrate 302 may include, in 700b: bonding 702 the substrate 102 onto the additional substrate 302. The additional substrate 302 can be provided (e.g. be preprocessed, also referred to as preprocessing) in such a way that it has a first electrode 502. The first electrode 502 can be provided for example in a preconfigured fashion.

The second substrate 302 may include for example an electrode ply 704 including the first electrode 502. The electrode ply 704 may include an (e.g. hydrophilic) adhesion material, e.g. an (e.g. hydrophilic) dielectric (e.g. an oxide), into which the first electrode 502 is embedded. The first electrode 502 may include a plurality of layers, of which a first layer 502a may include or be formed from a nitride, a second layer 502b may include or be formed from a semiconductor material (e.g. Si or SiC), a third layer 502c may include or be formed from a nitride, and a fourth layer 502d may include or be formed from a plurality of projections, e.g. including or formed from a semiconductor material (e.g. Si, e.g. poly-Si). Optionally, the first electrode may include a plurality of openings (ventilation openings) that penetrate through the plurality of layers of the first electrode 502.

The second substrate 302 (also referred to as target substrate) may include a substrate body 706, above which the first electrode 502 or the electrode ply 704 is arranged. Optionally, an insulation layer 302p, e.g. including or formed from an oxide, can be arranged between the substrate body 706 and the first electrode 502 or the electrode ply 704. The substrate body 706 may include or be formed from a or the semiconductor material, e.g. Si.

By way of example, an SiC carrier substrate 102, in 700a, can be provided with a superficial oxide layer 304 and subsequently be brought into contact with an already preprocessed target substrate 302 in 700b. Connecting the two substrates 102, 302 to one another can be carried out by means of a bonding process, e.g. by means of a molecular (hydrophilic) bonding process (i.e. molecular adhesion optionally reinforced by a thermal treatment).

Optionally, the first electrode 502 (e.g. the second layer 502b) may include a monocrystalline substrate segment or be formed therefrom (or at least from a part thereof), as will be described in even greater detail below (cf. 1200b).

Figure 8A:
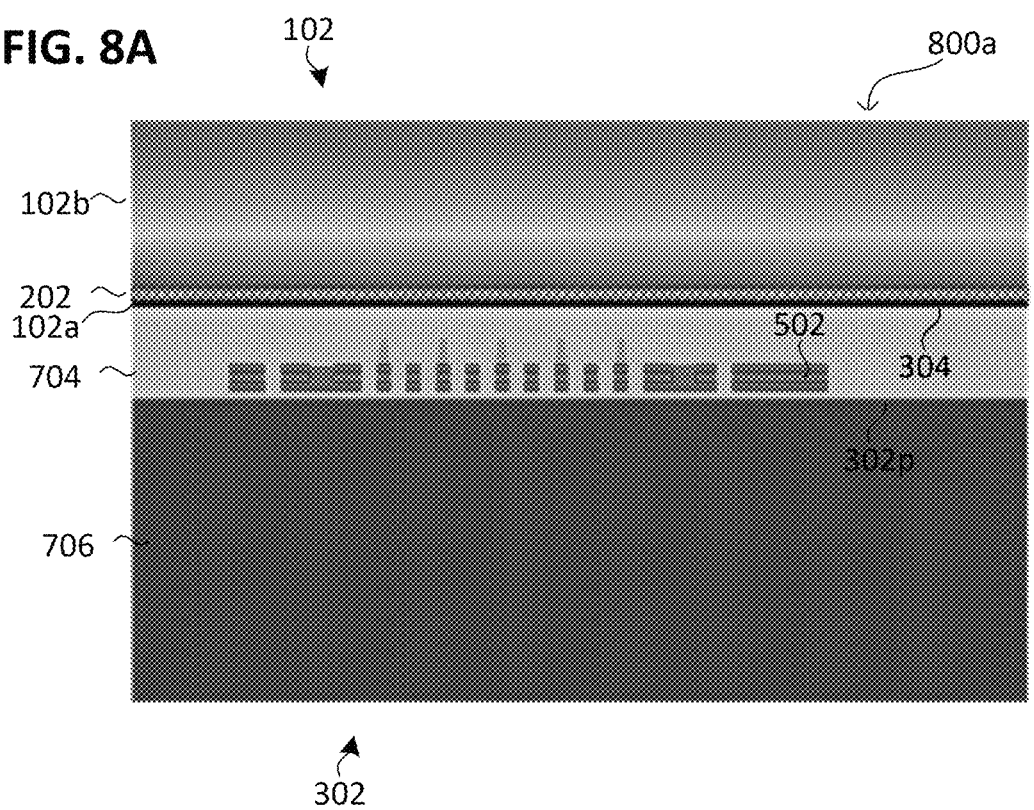
FIGS. 8A and 8B show in each case a micromechanical structure in a method in accordance with various embodiments.
Figure 8B:
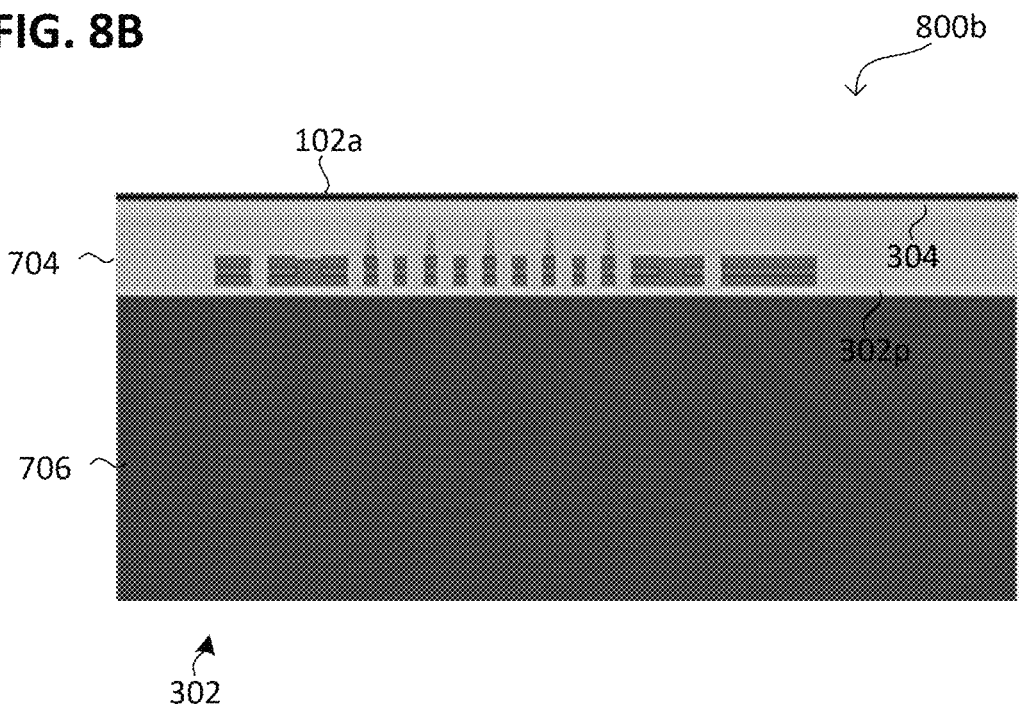

FIG. 8A and FIG. 8B illustrate in each case a method in accordance with various embodiments in a schematic side view or cross-sectional view (e.g. with the viewing direction along a main processing side 102o).

Severing the first substrate 102 may include, in 800a: thermally processing the first substrate 102, e.g. by thermal energy being fed to the first substrate 102. The thermal processing may include: heating the first substrate 102, e.g. to at least a temperature up to which the desired separating layer 202 is thermally stable and/or to at least approximately 700° C., e.g. to at least approximately 900° C. By means of the thermal processing of the first substrate 102, a structural alteration of the first substrate 102 can be brought about, e.g. in the desired separating layer 202. The structural alteration can bring about a cancellation of the connection of the two substrate segments 102a, 102b with respect to one another.

By way of example, in 800a, by means of a thermal treatment of the composite system including the first substrate 102 and the second substrate 302 (e.g. approximately 1 hour at approximately 500-900° C.), the layer stack 102a, 304 (e.g. $SiO_2$—SiC) can be separated from the SiC carrier substrate 102 in accordance with the predefined desired separating layer 202a (also referred to as splitting zone 202). The SiC carrier substrate can subsequently be reused (e.g. recycled) and serve for forming further sensors at the wafer level, as will be described in even greater detail below.

Severing the first substrate 102 may include, in 800b: removing the second substrate segment 102b from the first substrate segment 102a. By way of example, the first substrate segment 102a can be at least partly exposed in 800b.

Optionally, after severing in 800b altering the first substrate segment 102a can be carried out, e.g. chemically or structuring altering the first substrate segment 102a, e.g. structuring or altering the chemical composition of the first substrate segment 102a. Altering the chemical composition of the first substrate segment 102a can be carried out for example by means of the second ion implantation 204. The first ion implantation 204 can optionally be carried out beforehand (e.g. for forming the separating layer 202). Alternatively or additionally, the first ion implantation 204 and the second ion implantation 204 can differ, e.g. in at least the implanted material and/or the implantation depth of the implantation energy.

The structuring can be carried out for example by means of a lithography process and/or by means of plasma etching. The structuring may include for example: applying a hard mask (e.g. including or formed from photoresist, but with the first substrate segment 102a; and structuring the first substrate segment 102a by means of etching the first substrate segment 102a. Alternatively, a maskless structuring process can be used, e.g. a laser structuring process (e.g. a CNC laser process, i.e. a computer-aided numerically controlled laser process).

By means of altering the chemical composition of the first substrate segment 102a, it is possible to alter a modulus of elasticity and/or a mechanical hardness of the first substrate segment 102a, e.g. to reduce the modulus of elasticity and/or to reduce the mechanical hardness. By means of the structuring of the first substrate segment 102a, a mechanical stiffness of the first substrate segment 102a can be altered, e.g. reduced.

The monocrystalline layer 102a (e.g. a SiC layer 102a) (illustratively cleaved in a defined manner) remains connected to the target substrate 304 by means of the insulator layer 304 (e.g. including or formed from an oxide) and can for example later provide a membrane of a sensor. An optional alteration of the monocrystalline layer 102a (and thus of the membrane properties) can be carried out in 800b, e.g. by means of an implantation of nitride ($N_2$). If the monocrystalline layer 102a (e.g. SiC layer 102a) has a roughness greater than a stipulation on account of the severing (cleaving), smoothing (planarization) can be carried out before the deposition of further layers on the monocrystalline layer 102a (e.g. by means of a chemical mechanical processing (also referred to as CMP process).

FIG. 9A and FIG. 9B illustrate in each case a method in accordance with various embodiments in a schematic side view or cross-sectional view (e.g. with the viewing direction along a main processing side 102o).

Forming the micromechanical structure 106 may include, in 900a: electrically contacting the first electrode 502 and/or the first substrate segment 102a. By way of example, the first electrode 502 and/or the first substrate segment 102a can be connected to an electrical contact pad 902, e.g. by means of electrical lines (e.g. including plated-through holes), which may include or be formed from a metal. The electrical contact pads can be provided for example by means of a metallization 902. The metallization 902 can be electrically coupled (i.e. electrically conductively connected) for example by means of plated-through holes in each case to the first electrode 502, the substrate body 706 and/or the first substrate segment 102a. The metallization 902 and/or the electrical lines can be electrically conductive, i.e. have an electrical conductivity of more than approximately $10^6$ siemens/meter. The metallization and/or the electrical lines may include or be formed from a metal, e.g. a cohesion-resistant metal (e.g. noble metal) such as molybdenum, tungsten and/or gold, or else some other metal such as copper and/or aluminum. Alternatively or additionally, the metallization 902 may include or be formed from a nitride (e.g. tantalum nitride) (can likewise be corrosion-resistant).

Forming the micromechanical structure 106 can optionally include, in 900a: forming one or a plurality of layers above the first substrate segment 102a, of which at least one first layer 904 may include or be formed from a dielectric (e.g. an oxide) and/or of which at least one second layer 902 (e.g. a metallization 902) may include or be formed from a metal, and of which optionally at least one third layer 906 may include or be formed from a passivation material (also referred to as passivation layer 906). The passivation layer 906 may include for example a plurality of openings (also referred to as contact openings), of which each opening exposes a contact pad of the metallization 902. The contact openings can be formed for example by means of an etching process and/or by means of a lithography process. The passivation material can be electrically insulating, i.e. have an electrical conductivity in a range of less than approximately $10^{-6}$ siemens/meter. By way of example, the passivation material can be an oxide (e.g. a semiconductor oxide), polymer (e.g. a resin or lacquer) or nitride (e.g. a semiconductor nitride).

Forming the micromechanical structure 106 can optionally include, in 900a: forming an opening 9060 (first opening 9060) above the first substrate segment 102a, e.g. in the passivation layer 906.

Forming the micromechanical structure 106 may include, in 900b: thinning the additional substrate 302 and/or forming an opening 7060 (second opening 7060) in the additional substrate 302. Thinning and/or forming the second opening 7060 can be carried out from an opposite side of the additional substrate 302 relative to the first substrate segment 102a. The opening 7060 can extend through the substrate body 706, for example. Forming the opening 7060 in the additional substrate 302 can stop for example at the insulation layer 302p. By way of example, the insulation layer 302p can be used as an etch stop.

Figure 10:
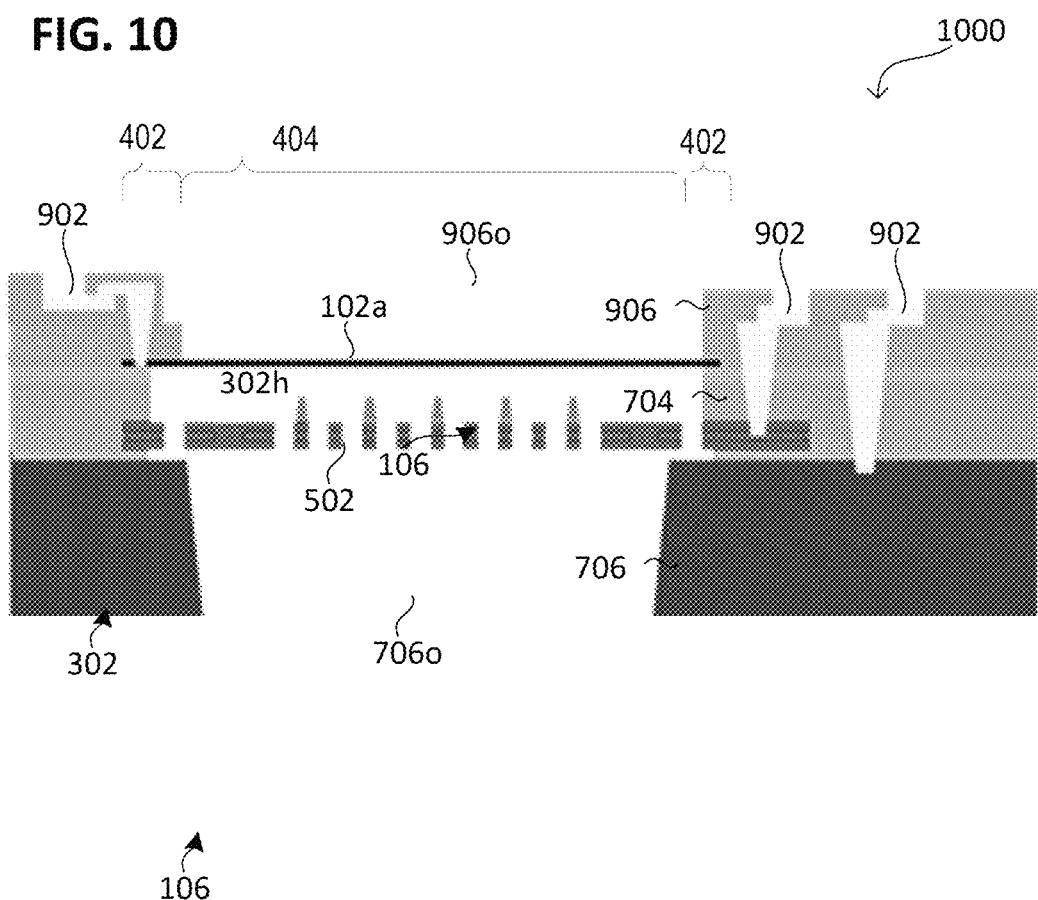
FIG. 10 shows a micromechanical structure in a method in accordance with various embodiments.

FIG. 10 illustrate in each case a method in accordance with various embodiments in a schematic side view or cross-sectional view (e.g. with the viewing direction along a main processing side 102o).

Forming the micromechanical structure 106 may include, in 1000: exposing (e.g. mechanically freeing) the first electrode 502 and/or the first substrate segment 102a (at least in the second section 404), e.g. in each case on mutually opposite sides. Exposing can be carried out by enlarging the first opening 9060 and/or the second opening 7060. By means of the exposing, it is possible to form a cavity 302h (i.e. a section of the second opening 7060) between the first electrode 502 and the first substrate segment 102a. The vertical extent of the cavity 302h can be defined by means of the thickness of the electrode ply 704.

The first substrate segment 102a (e.g. its second section 404) can be coupled to the additional substrate 302 by means of the suspension section 402. Alternatively or additionally, the first substrate segment 102a (e.g. its second section 404) can be electrically contacted by means of the suspension section 402.

The freely suspended section 404 can be exposed by means of the first opening 9060 and/or by means of the second opening 7060 and/or separate them from one another.

The micromechanical structure 106 (e.g. a capacitive sensor) illustrated in FIG. 10 can be provided for example in a single-electrode configuration (also referred to as single-counterelectrode configuration; by way of example, the membrane can be regarded as electrode to counterelectrode). The single-electrode configuration may include a functional region 404, which is deflectable relative to the additional substrate 302 (e.g. into the first cavity 302h) as a reaction to a force acting thereon, and exactly one first electrode 502. The first electrode 502 and the functional region 404 can be capacitively coupled to one another. The first electrode 502 can be arranged between the functional region 404 and the substrate body 706 (also referred to as bottom single-electrode configuration or bottom single-counterelectrode configuration). The first substrate segment 102a can provide for example the membrane 408 or the cantilever 410.

Figure 11A:
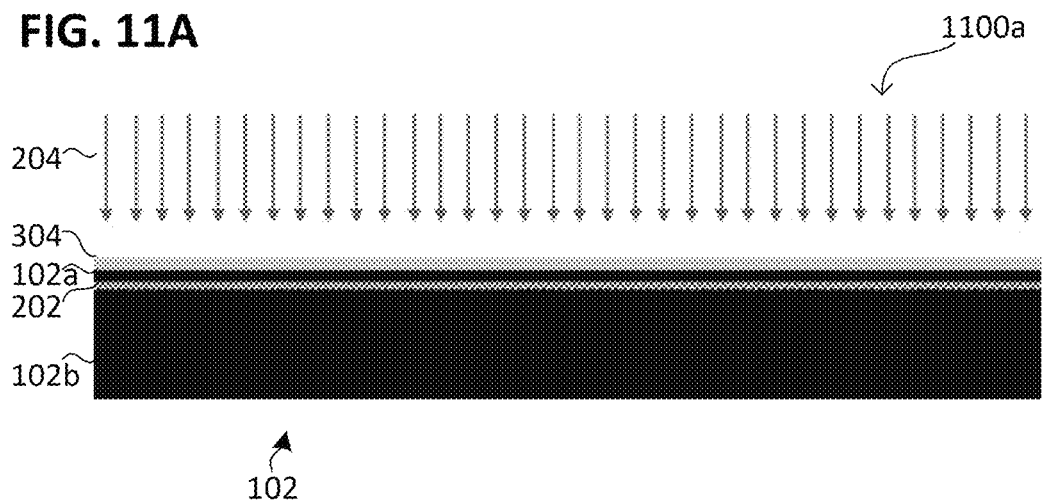
FIGS. 11A and 11B show in each case a micromechanical structure in a method in accordance with various embodiments.
Figure 11B:
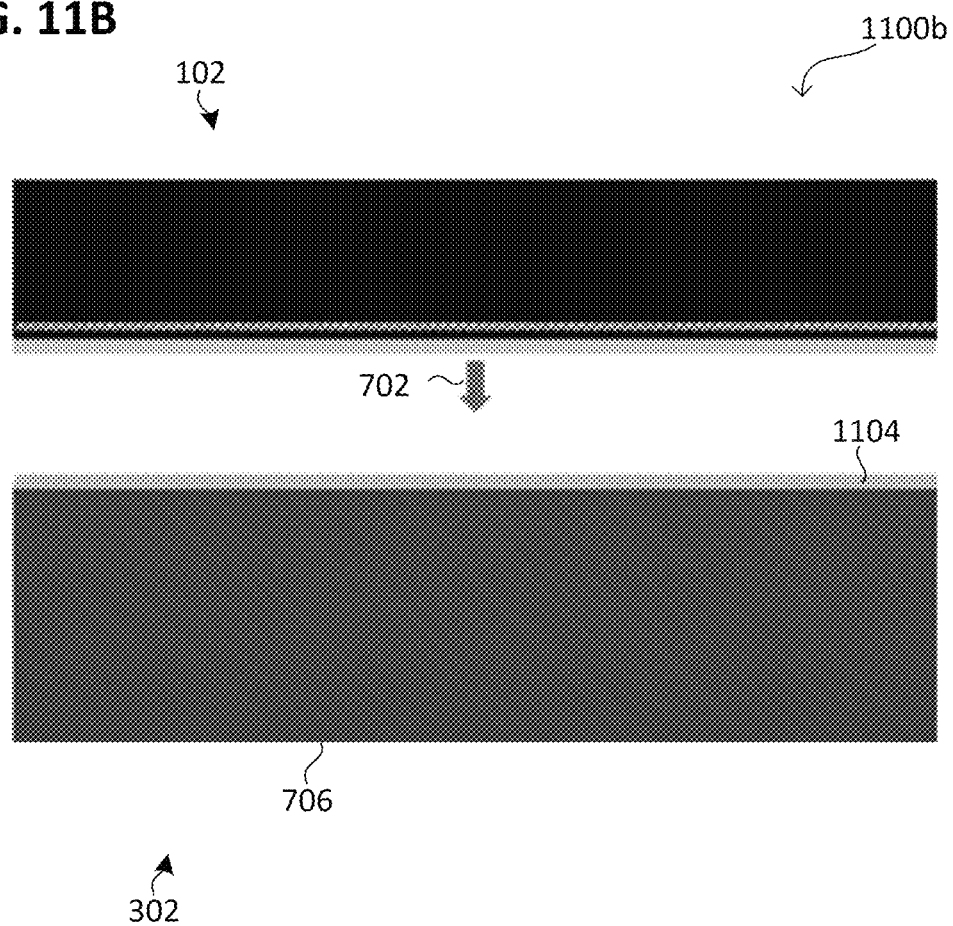

FIG. 11A and FIG. 11B illustrate in each case a method in accordance with various embodiments in a schematic side view or cross-sectional view (e.g. with the viewing direction along a main processing side 102o).

Providing the first substrate 102 in 1100a can be configured as in 700a.

Securing the first substrate 102 on the second substrate 302 in 1100b can be configured as in 700b, except that the electrode of the second substrate 302 is omitted. The second substrate 302 in 1100b may include an additional (e.g. hydrophilic) adhesion layer 1104, which may include or be formed from the adhesion material and/or is in physical contact with the substrate body 706. The (e.g. dielectric) adhesion material may include or be formed from an oxide and/or a dielectric, e.g. a semiconductor oxide, e.g. silicon oxide.

Figure 12A:
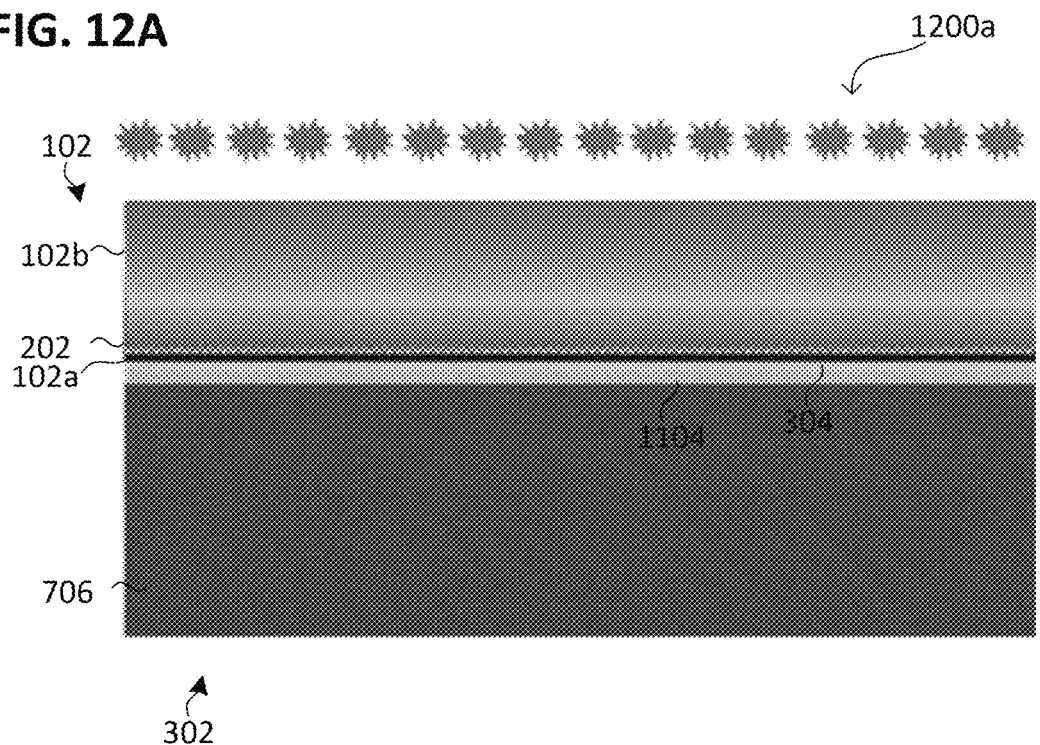
FIGS. 12A and 12B show in each case a micromechanical structure in a method in accordance with various embodiments.
Figure 12B:
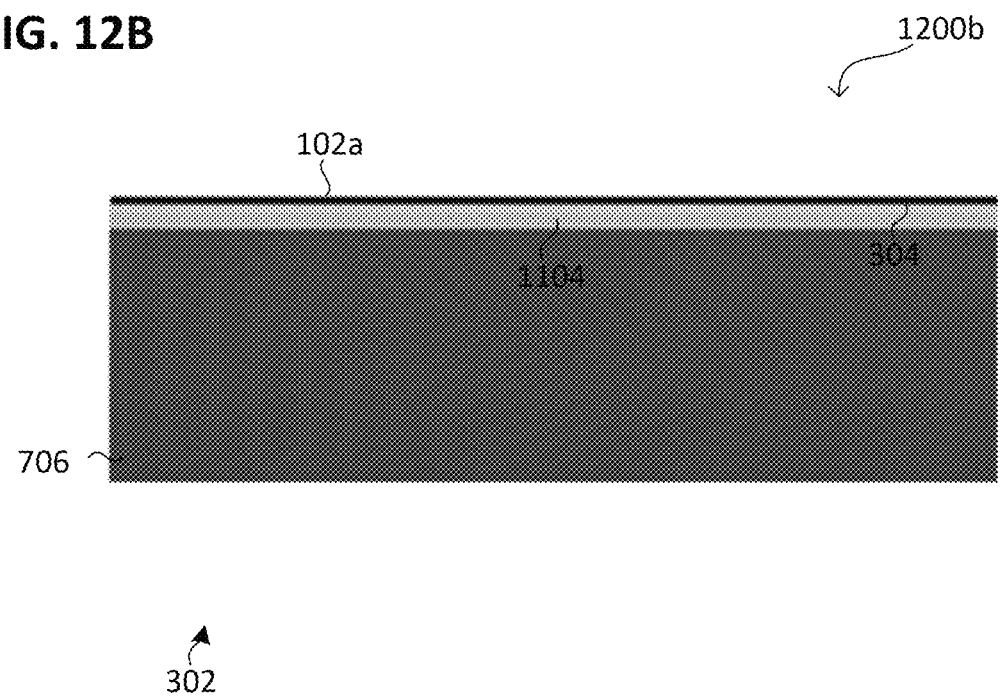

FIG. 12A and FIG. 12B illustrate in each case a method in accordance with various embodiments in a schematic side view or cross-sectional view (e.g. with the viewing direction along a main processing side 102o).

Severing the first substrate 102 in 1200a can be configured as in 800a (except that the second substrate 302 has no electrode). The optional altering of the first substrate segment 102a in 1200b can be configured as in 800b.

In accordance with various embodiments, in 1200b, forming a first electrode 502 can be carried out, which first electrode (e.g. the second layer 502b thereof) includes or is formed from the first substrate segment 102a (also referred to as preprocessing of the second substrate 302). In that case, it is possible to continue with method step 800a.

Therefore, alternatively, provision can be made for forming a functional structure 544, which includes or is formed from the first substrate segment 102a. In that case, it is possible to continue with method step 1300a.

Figure 13A:
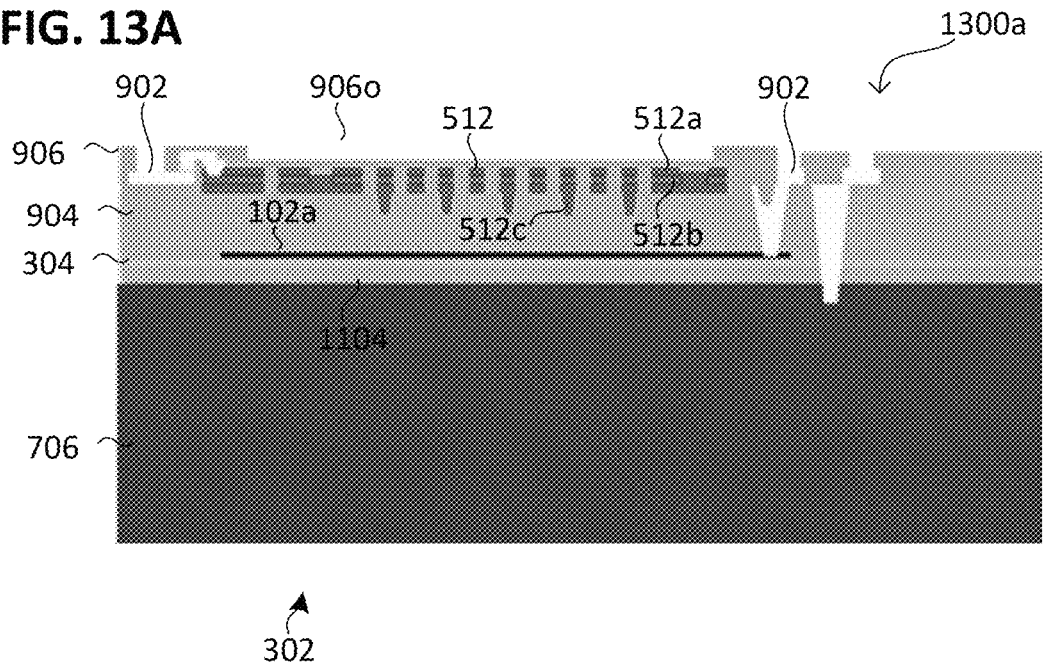
FIGS. 13A and 13B show in each case a micromechanical structure in a method in accordance with various embodiments.
Figure 13B:
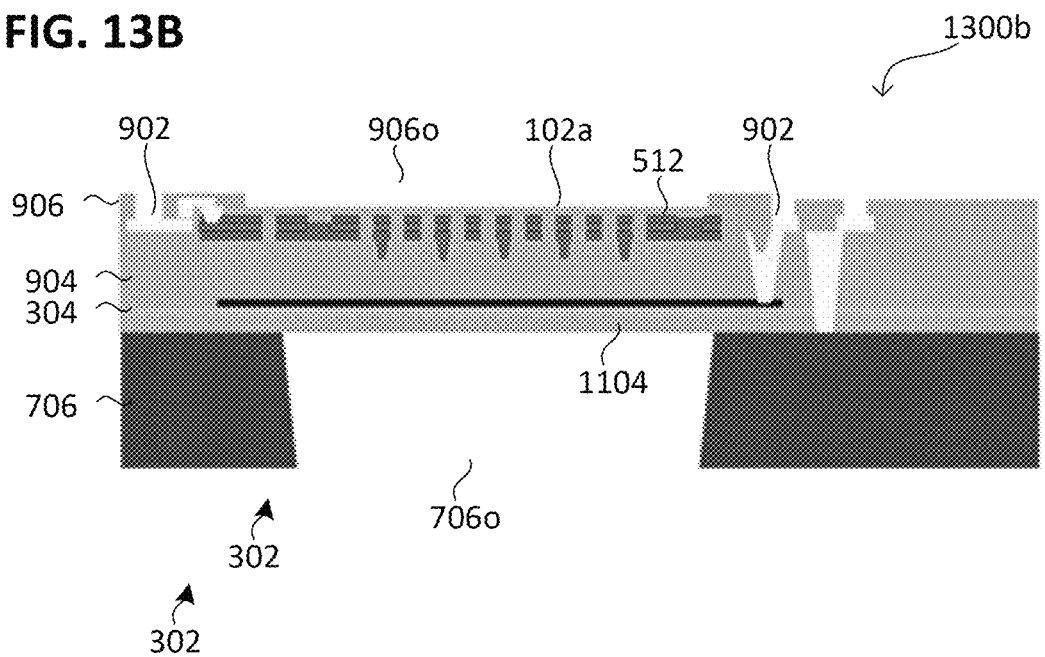

FIG. 13A and FIG. 13B illustrate in each case a method in accordance with various embodiments in a schematic side view or cross-sectional view (e.g. with the viewing direction along a main processing side 102o).

Forming the micromechanical structure 106 may include, in 1300a: forming the second electrode 512 above the first substrate segment 102a.

The second electrode 512 may include a plurality of layers, of which a first layer 512a may include or be formed from a nitride, a second layer 512a may include or be formed from a semiconductor material (e.g. Si, e.g. poly-Si), a third layer 512c may include or be formed from a nitride, and a fourth layer may include or be formed from a plurality of projections, e.g. including or formed from a semiconductor material (e.g. Si, e.g. poly-Si). Optionally, the second electrode 512 may include a plurality of openings (ventilation openings) that penetrate through the plurality of layers of the second electrode 512.

Forming the micromechanical structure 106 may include, in 1300*a*: electrically contacting the second electrode 512 and/or the first substrate segment 102*a*. By way of example, the second electrode 512 and/or the first substrate segment 102*a* can be connected to an electrical contact pad 902, e.g. by means of electrical lines (e.g. including plated-through holes), which may include or be formed from a metal. The electrical contact pads can be provided for example by means of a metallization 902. The metallization 902 can be electrically coupled (i.e. electrically conductively connected) for example by means of plated-through holes in each case to the second electrode 512, the substrate body 706 and/or the first substrate segment 102*a*. The metallization 902 and/or the electrical lines can be electrically conductive, i.e. have an electrical conductivity of more than approximately $10^6$ siemens/meter. The metallization 902 and/or the electrical lines may include or be formed from a metal, e.g. a cohesion-resistant metal (e.g. noble metal) such as molybdenum, tungsten and/or gold, or else some other metal such as copper and/or aluminum. Alternatively or additionally, the metallization 902 may include or be formed from a nitride (e.g. tantalum nitride) (can likewise be corrosion-resistant).

Forming the micromechanical structure 106 can optionally include, in 1300*a*: forming one or a plurality of layers above the first substrate segment 102*a*, of which at least one layer 904 may include or be formed from an oxide and/or of which at least one layer 902 may include be formed from a metallization 902, and of which optionally at least one layer 906 may include or be formed from a passivation material. The passivation layer 906 may include for example a plurality of openings, of which each opening exposes a contact pad of the metallization 902. The passivation material can be electrically insulating, i.e. have an electrical conductivity of less than approximately $10^{-6}$ siemens/meter. By way of example, the passivation material can be an oxide (e.g. a semiconductor oxide), polymer (e.g. a resin or lacquer) or nitride (e.g. a semiconductor nitride).

Forming the micromechanical structure 106 can optionally include, in 1300*a*: forming a first opening 906*o* above the first substrate segment 102*a* and/or above the second electrode, e.g. in the passivation layer 906.

Forming the second electrode 512 can optionally include, in 1300*a*: forming the second electrode 512 (e.g. the second layer 512*b* thereof), which includes or is formed from a second monocrystalline substrate segment 102*b*. By way of example, the second monocrystalline substrate segment 102*b* can be provided by means of severing the substrate remainder.

Forming the micromechanical structure 106 may include, in 1300*b*: thinning the additional substrate 302 and/or forming a second opening 7060 in the additional substrate 302. Thinning and/or forming the second opening 7060 can be carried out from an opposite side of the additional substrate 302 relative to the first substrate segment 102*a*. The opening 7060 can extend for example through the substrate body 706. Forming the opening 7060 in the additional substrate 302 can stop for example at the additional adhesion layer 1104. By way of example, the additional adhesion layer 1104 can be used as an etch stop.

Figure 14:
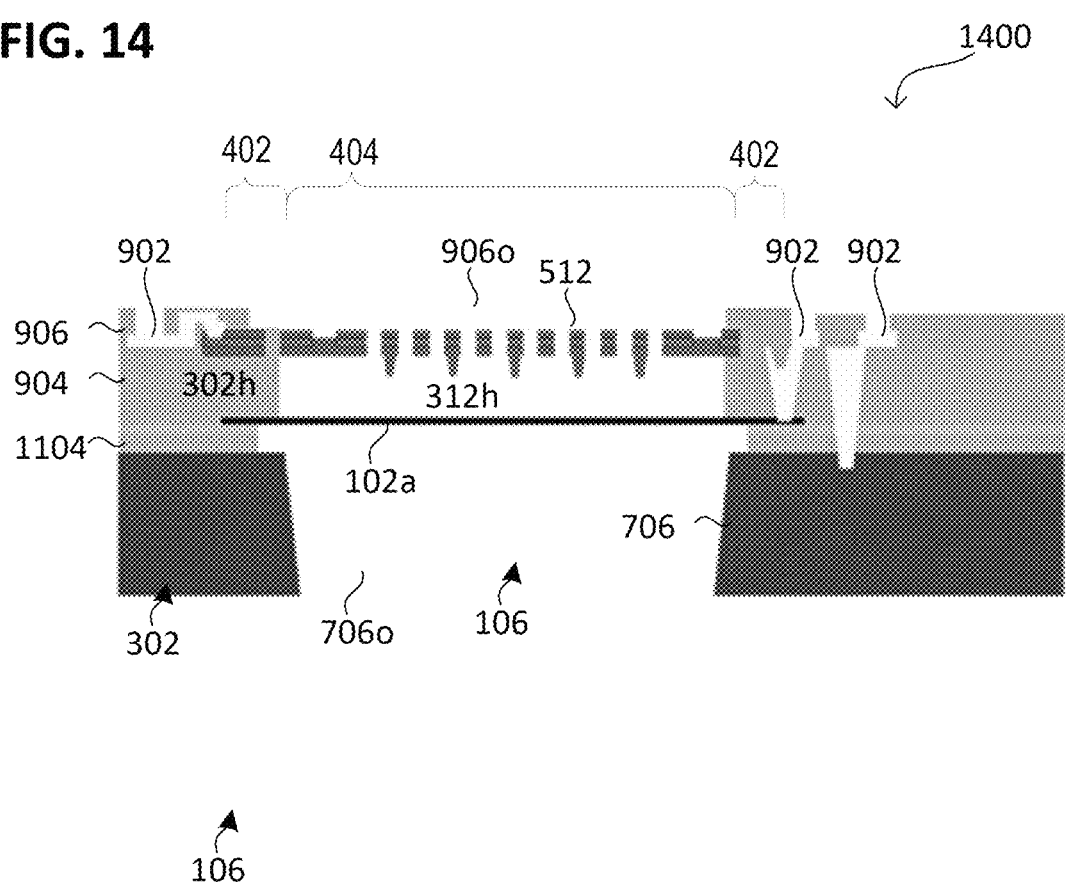
FIG. 14 shows a micromechanical structure in a method in accordance with various embodiments.

FIG. 14 illustrate in each case a method in accordance with various embodiments in a schematic side view or cross-sectional view (e.g. with the viewing direction along a main processing side 102*o*).

Forming the micromechanical structure 106 may include, in 1400: exposing (e.g. mechanically freeing) the second electrode 512 and/or the first substrate segment 102*a*. The exposing can be carried out by enlarging the first opening 9060 and/or the second opening 7060, e.g. on mutually opposite sides. By means of the exposing, a cavity 312*h* (i.e. a section of the first opening 9060) can be formed between the second electrode 512 and the first substrate segment 102*a*.

The first substrate segment 102*a* can be coupled to the additional substrate 302 by means of the suspension section 402. Alternatively or additionally, the first substrate segment 102*a* can be electrically contacted by means of the suspension section 402.

The freely suspended section 404 can be exposed by means of the first opening 906*o* and/or by means of the second opening 706*o* and/or separate them from one another.

The micromechanical structure 106 (e.g. a capacitive sensor) illustrated in FIG. 14 can be provided for example in a single-electrode configuration (also referred to as single-counterelectrode configuration). The single-electrode configuration may include a functional region 404, which is deflectable relative to the additional substrate 302 as a reaction to a force acting thereon, and exactly one second electrode 512. The second electrode 512 and the functional region 404 can be capacitively coupled to one another. The functional region 404 can be arranged between the second electrode 512 and the substrate body 706 (also referred to as top single-electrode configuration or top single-counterelectrode configuration).

The substrate segment 102*a* arranged between the second electrode 512 and the substrate body 706 can provide for example the membrane 408 or the cantilever 410. Alternatively, the first substrate segment 102*a* can be used for forming the second electrode 512. By way of example, the second layer 512*b* of the second electrode 512 may include the first substrate segment 102*a* or be formed therefrom (or at least from a part thereof).

Optionally, a second substrate segment 102*b* can be used for forming the second electrode 512. By way of example, the second layer 512*b* of the second electrode 512 may include the second substrate segment 102*b* or be formed therefrom (or at least from a part thereof).

Figure 15A:
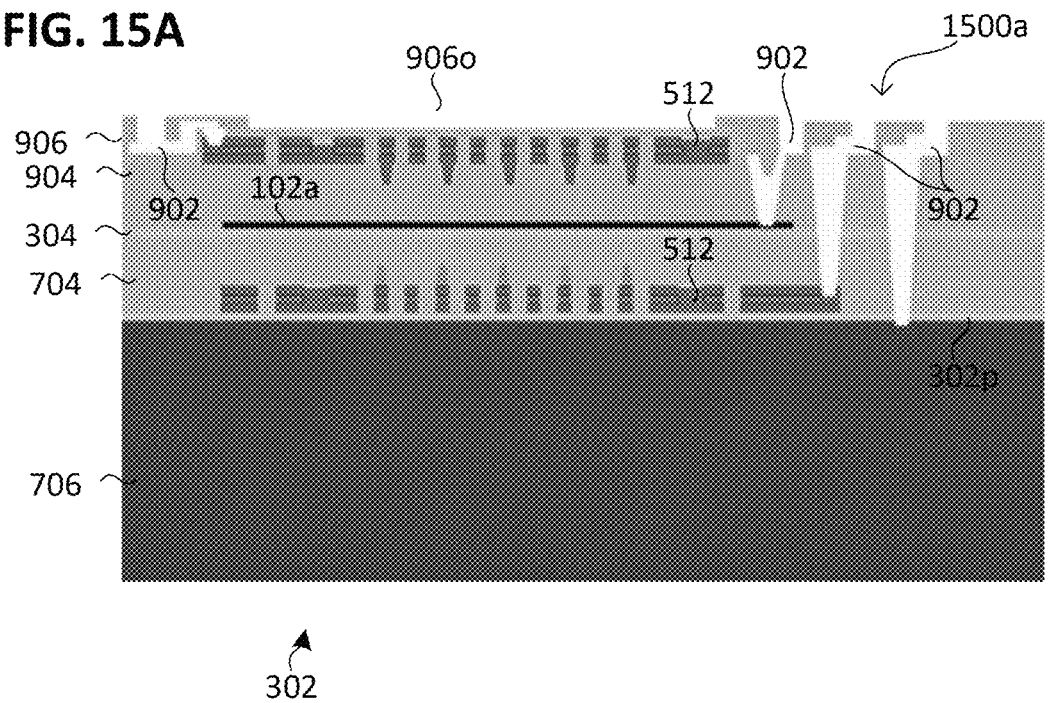
FIGS. 15A and 15B show in each case a micromechanical structure in a method in accordance with various embodiments.
Figure 15B:
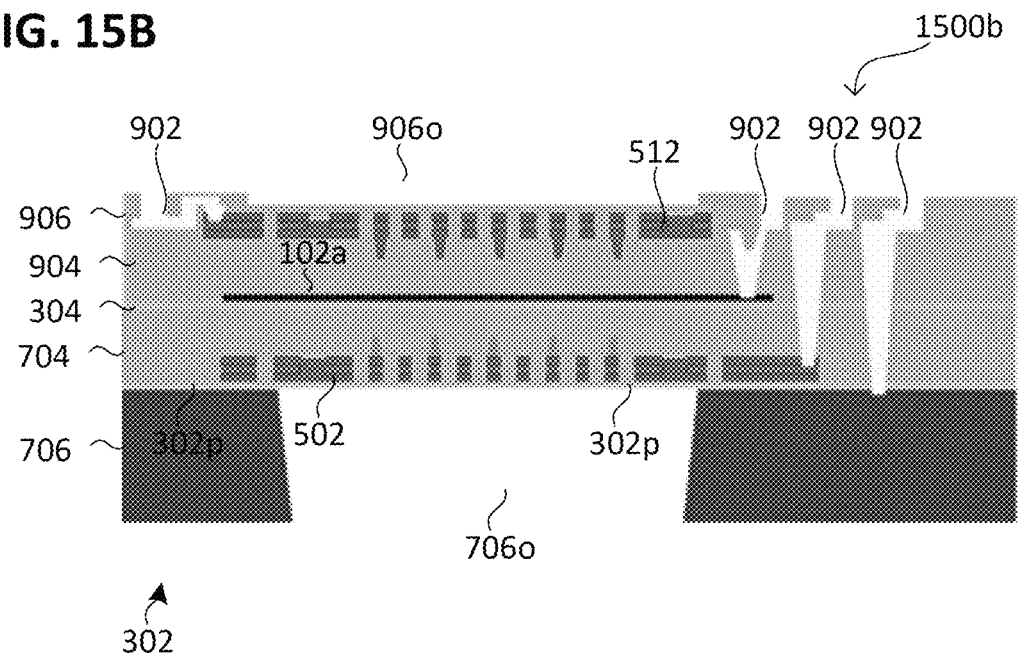

FIG. 15A and FIG. 15B illustrate in each case a method in accordance with various embodiments in a schematic side view or cross-sectional view (e.g. with the viewing direction along a main processing side 102*o*).

Forming the micromechanical structure 106 may include, in 1500*a*: providing the first substrate segment 102*a* and/or the second substrate 302, e.g. configured as in 800*a* and/or in 800*b*.

Forming the micromechanical structure 106 may include, in 1500*a*: forming the second electrode 512 above the first substrate segment 102*a*, e.g. configured like 1300*a*.

Forming the micromechanical structure 106 may include, in 1500*b*: thinning the additional substrate 302 and/or forming an opening 706*o* (second opening 706*o*), in the additional substrate 302. Thinning and/or forming the second opening 706*o* can be carried out from an opposite side of the additional substrate 302 relative to the first substrate segment 102*a*. The opening 706*o* can extend for example through the substrate body 706. Forming the opening 706*o* in the additional substrate 302 can stop for example at the insulation layer 302*p*. By way of example, the insulation layer 302*p* can be used as an etch stop.

The metallization 902 (e.g. including contact pads) can be electrically coupled (i.e. electrically conductively connected) for example by means of plated-through holes in each case to the first electrode 502, the second electrode 512, the substrate body 706 and/or the first substrate segment 102a. The metallization 902 and/or the electrical lines can be electrically conductive, i.e. have an electrical conductivity of more than approximately $10^6$ siemens/meter. The metallization 902 and/or the electrical lines may include or be formed from a metal, e.g. copper and/or aluminum.

Figure 16:
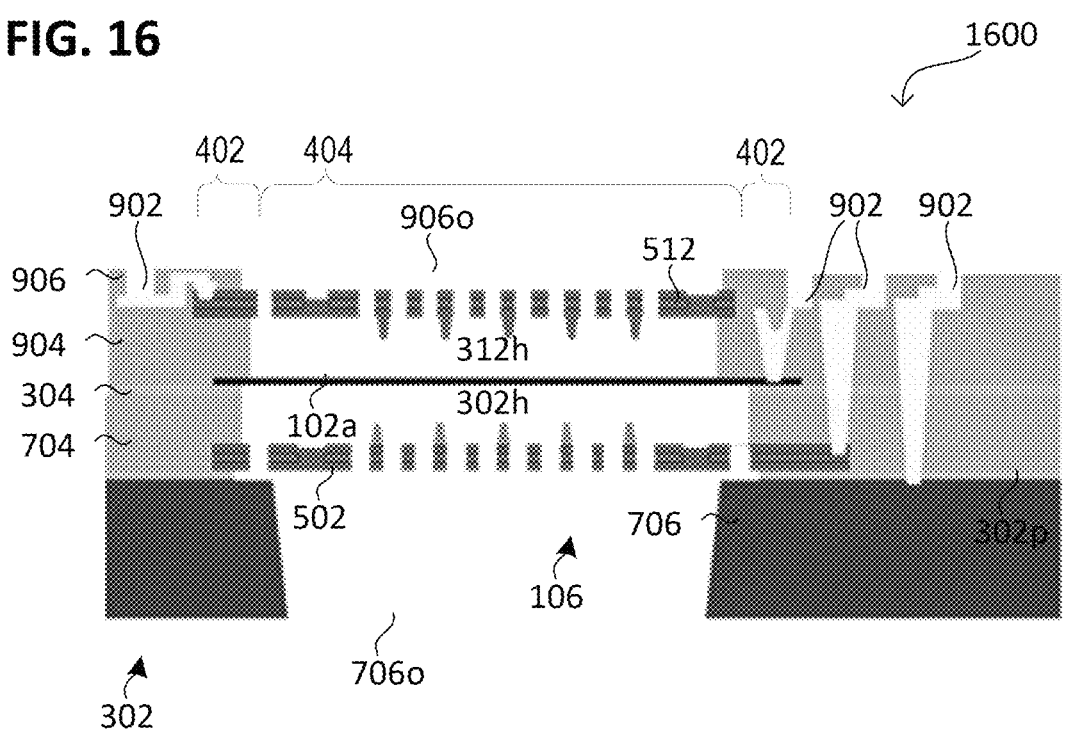
FIG. 16 shows a micromechanical structure in a method in accordance with various embodiments.

FIG. 16 illustrate in each case a method in accordance with various embodiments in a schematic side view or cross-sectional view (e.g. with the viewing direction along a main processing side 102o).

Forming the micromechanical structure 106 may include, in 1600: exposing (e.g. mechanically freeing) the first electrode 502, the second electrode 512 and/or the first substrate segment 102a. Exposing can be carried out by enlarging the first opening 906o and/or the second opening 706o, e.g. in each case on mutually opposite sides. By means of the exposing, the first cavity 302h (i.e. a section of the second opening 706o) can be formed between the first electrode 502 and the first substrate segment 102a. By means of the exposing, a second cavity 312h (i.e. a section of the first opening 906o) can be formed between the second electrode 512 and the first substrate segment 102a.

The first substrate segment 102a can be coupled to the additional substrate 302 by means of the suspension section 402. Alternatively or additionally, the first substrate segment 102a can be electrically contacted by means of the suspension section 402.

The freely suspended section 404 can be exposed by means of the first opening 906o and/or by means of the second opening 706o and/or separate them from one another.

The micromechanical structure 106 (e.g. a capacitive sensor) illustrated in FIG. 16 can be provided for example in a double-electrode configuration (also referred to as dual-counterelectrode configuration). The double-electrode configuration may include a functional region 404, which is deflectable relative to the additional substrate 302 as a reaction to a force acting thereon, and exactly two electrodes 502, 512, between which the functional region 404 is arranged. The first electrode 502, the second electrode 512 and the functional region 404 can be capacitively coupled to one another.

The substrate segment 102a arranged between the two electrodes 502, 512 can provide for example the membrane 408 or the cantilever 410. Optionally, a second substrate segment 102b can be used for forming the first electrode 502 or the second electrode 512. Alternatively, the substrate segment 102a can be used for forming the first electrode 502 or the second electrode 512.

In accordance with various embodiments, a double-electrode configuration can be provided, in which at least one electrode 502, 512 and/or the functional region 404 may include or be formed from a monocrystalline material, e.g. monocrystalline GaN, monocrystalline SiC and/or monocrystalline Si.

The double-electrode configuration can provide for example a sensor (e.g. a microphone). In comparison with the single-electrode configuration, the double-electrode configuration can have a greater SNR and/or a lower THD. The production of the double-electrode configuration can be carried out for example analogously to that of the top single-electrode configuration and differ therefrom in that the target substrate 302 is preprocessed.

Figure 17:
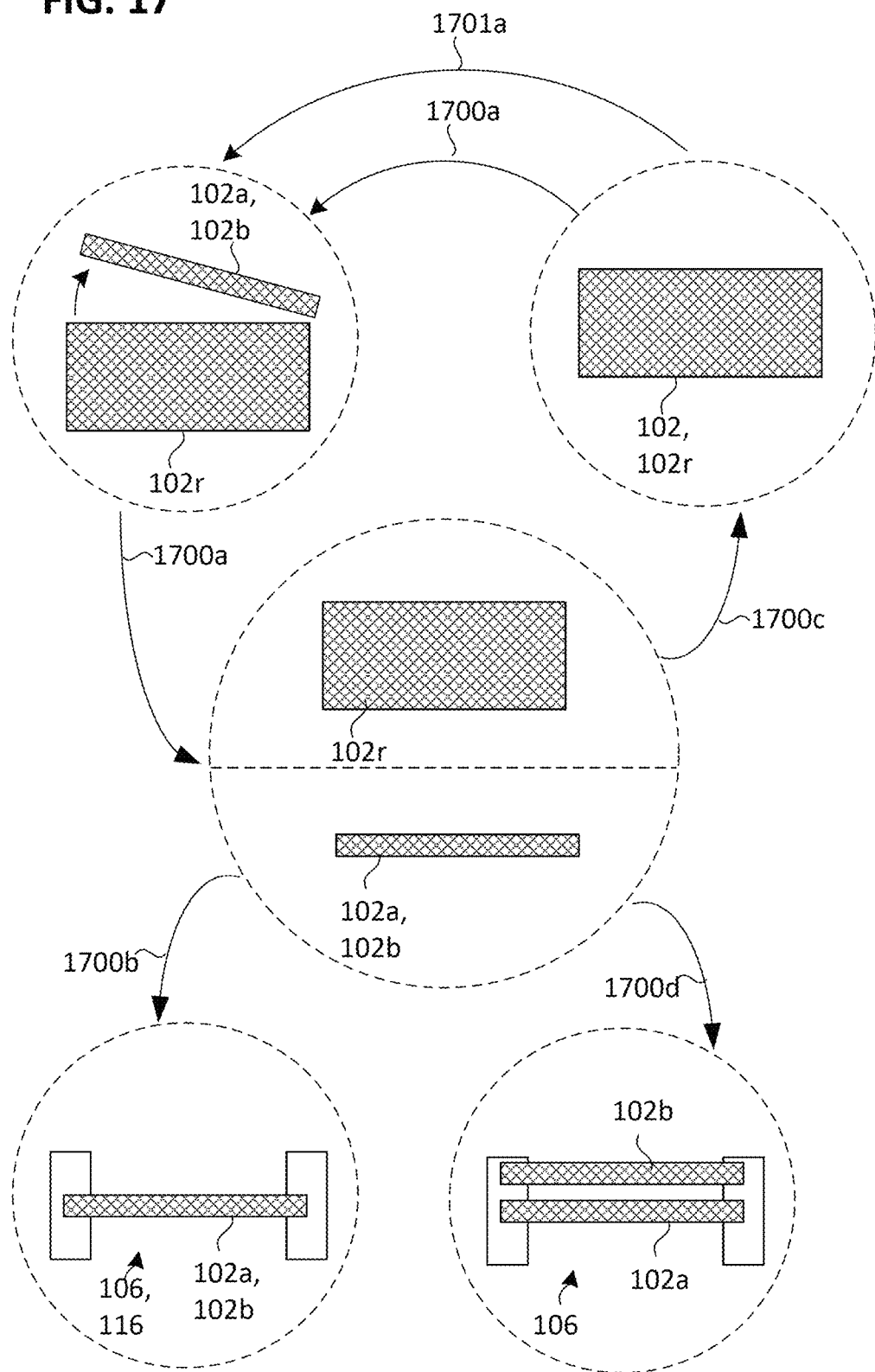
FIG. 17 shows a method in accordance with various embodiments.

FIG. 17 illustrate in each case a method in accordance with various embodiments in a schematic side view or cross-sectional view (e.g. with the viewing direction along a main processing side 102o).

The method may include, in 1700a: dividing a first monocrystalline layer 102a from a substrate 102 by severing the substrate 102 in a monocrystalline region (wherein a substrate remainder 102r of the substrate 102 remains).

The method may include, in 1700b: forming a first micromechanical structure 106 including the first monocrystalline layer 102a. The first monocrystalline layer 102a can provide for example the functional structure 544, the stiffening structure 602, the first electrode 502 or the second electrode 512 of the first micromechanical structure 106.

The method can optionally include, in 1700c: providing a substrate 102, which includes or is formed from the substrate remainder 102r. Providing can optionally include: thermally processing the substrate remainder 102r, e.g. by annealing the latter (e.g. in order to anneal the crystal structure).

The method can optionally include, in 1701a: dividing a second monocrystalline layer 102b from the substrate 102 (i.e. from the substrate remainder 102r used as substrate 102) by severing the substrate 102 in a monocrystalline region, wherein a substrate remainder 102r of the substrate 102 remains.

The method can optionally include, in 1700b: forming a second micromechanical structure 116 including the second monocrystalline layer 102b. The second monocrystalline layer 102b can provide for example the functional structure 544, the stiffening structure 602, the first electrode 502 or the second electrode 512 of the second micromechanical structure 116.

Alternatively, in 1700d, the second monocrystalline layer 102b can be added to the first micromechanical structure 106. The second monocrystalline layer 102b can provide for example the functional region, the stiffening structure 602 or the second electrode 512 of the second micromechanical structure 116. By way of example, the first monocrystalline layer 102a can provide the functional structure 544 of the first micromechanical structure 106 and the second monocrystalline layer 102b can provide an electrode 502, 512 of the first micromechanical structure 106.

Providing monocrystalline layers 102a, 102b by means of severing the remaining substrate remainder 102r can be carried out (also referred to as reusing the substrate) until the monocrystalline substrate 102 has been consumed. The monocrystalline substrate 102 can thus be better utilized, which reduces costs.

In accordance with various embodiments, the severing can be carried out by means of a smart cut process. Smart cut can be understood to be a technological process which makes it possible to transfer layers composed of monocrystalline semiconductor material to a technical carrier (i.e. the second substrate) (also referred to as transferring).

By way of example, a silicon-on-insulator substrate or a silicon-carbide-on-insulator substrate can be provided, which includes the second substrate 302 and the monocrystalline layer 102a, 102b.

In accordance with various embodiments, it has been recognized that the importance of stress decoupling increases greatly in the case of membrane-based sensors, e.g. since the alteration of the mechanical properties of conventionally used material systems has already reached its technological limit. Therefore, it is expected that loadings of the MEMS will be able to be reduced exclusively by changes to the geometry and/or the design. In order to open up further space for changes which are reproducible cost-effectively and reliably at a low technological level, other materials are thus required, the unmodified properties of which already satisfy or at least almost satisfy the requirements imposed.

In accordance with various embodiments, illustratively a micromechanical structure and a method for producing it are provided which open up further space for changes and adaptations of the mechanical properties. Illustratively, a robust membrane (e.g. for a microphone and/or pressure sensor), i.e. having a long lifetime, can be provided which satisfies stringent requirements in respect of the sensitivity.

Illustratively, it has been recognized that a monocrystalline material (e.g. monocrystalline SiC) offers greater space for changes and adaptations. In accordance with various embodiments, silicon carbide (Sic) can be used as membrane material. Silicon carbide can provide a great mechanical hardness, chemical resistance (inertness) and thermal resistance, i.e. material properties which make it easier to satisfy at least some requirements without additional modifications, such that the space for adaptations is maintained.

Conventional processes for forming SiC are restricted to the use of low temperatures, e.g. less than 700° C. and/or produce polycrystalline microstructures. The conventional production of thin deflectable membranes composed of a monocrystalline material leads to a low crystalline homogeneity of the material and low homogeneity in terms of the thickness to which the monocrystalline material is thinned. This low homogeneity can result in great fluctuations in the mechanical properties, such that the requirements imposed fail to be achieved. Therefore, it is conventional practice to resort to polycrystalline materials if stringent requirements in respect of the homogeneity need to be satisfied.

In accordance with various embodiments, a micromechanical structure and a method for producing it can be provided for use in power electronics.

In accordance with various embodiments, a method for producing a monocrystalline substrate may include the following: severing the substrate along a main processing side into at least two (i.e. a plurality, e.g. exactly two or more than two) monocrystalline substrate segments; and forming a micromechanical structure including at least one (i.e. exactly one or more than one) monocrystalline substrate segment of the at least two substrate segments. The substrate can optionally be secured on a carrier, which need not necessarily be monocrystalline. The at least one substrate segment need not necessarily denote that complete part of the substrate which is separated, but rather can be part thereof.

In accordance with various embodiments, the severing can be carried out by means of a Smartcut process.

In accordance with various embodiments, the substrate and/or each substrate segment of the two substrate segments may include or be formed from a monocrystalline semiconductor material, e.g. monocrystalline silicon carbide (Sic), monocrystalline gallium nitride (GaN) or monocrystalline silicon (Si).

In accordance with various embodiments, the at least one monocrystalline substrate segment (also referred to as first substrate segment) may include a monocrystalline layer or be formed therefrom (or at least from a part thereof). Alternatively or additionally, the other monocrystalline substrate segment (also referred to as second substrate segment) may include a monocrystalline substrate remainder or be formed therefrom (or at least from a part thereof). The other substrate segment need not necessarily denote that complete substrate remainder of the substrate which is separated, but rather can be part thereof.

In accordance with various embodiments, the at least one monocrystalline substrate segment can have a smaller (e.g. vertical) extent than the other monocrystalline substrate segment.

In accordance with various embodiments, the substrate can furthermore include a desired separating layer, by means of which the two substrate segments are connected to one another; wherein the severing is carried out by cancelling a cohesion of the desired separating layer. By way of example, the substrate can be divided or thermally destabilized in the desired separating layer. Alternatively or additionally, a mechanical force (e.g. a tensile force) can be transmitted to the desired separating layer, which force exceeds the breaking force of the desired separating layer.

In accordance with various embodiments, the method can furthermore include: forming the desired separating layer by altering a chemical composition (of the substrate) between the two substrate segments.

In accordance with various embodiments, a resistance of the substrate between the two substrate segments vis-à-vis the severing can be reduced by means of the altering.

In accordance with various embodiments, the altering can be carried out by means of hydrogenating.

In accordance with various embodiments, forming the desired separating layer can be carried out by means of an ion implantation.

In accordance with various embodiments, introducing a first impurity into the substrate can be carried out by means of the ion implantation (also referred to as first ion implantation).

In accordance with various embodiments, the ion implantation can be carried out through the at least one monocrystalline substrate segment.

In accordance with various embodiments, the method can furthermore include: securing the at least one monocrystalline substrate segment on an additional substrate before the severing.

The monocrystalline substrate segment may include a freely suspended section and an anchored section (also referred to as securing section) of the micromechanical structure, wherein the freely suspended section is coupled to the additional substrate (e.g. secured thereon) by means of the anchored section. By way of example, the anchored section may include or be formed from at least one part of the monocrystalline substrate segment and the freely suspended section may include or be formed from another part of the monocrystalline substrate segment. The freely suspended section (illustratively a cantilever) can be exposed on mutually opposite sides and/or project from the additional substrate (also referred to as cantilevered).

In accordance with various embodiments, the securing may include bonding the substrate and the additional substrate onto one another, e.g. by means of hydrophilic bonding, anodic bonding or thermal bonding.

The first substrate segment and/or the second substrate segment can have a greater mechanical hardness and/or a greater modulus of elasticity than the additional substrate.

In accordance with various embodiments, securing can be carried out by means of an (e.g. ceramic and/or hydrophilic) adhesion layer arranged between the at least one monocrystalline substrate segment and the additional substrate.

In accordance with various embodiments, the securing can be carried out by heating the adhesion layer (e.g. to a temperature in a range of approximately 110° C. to approximately 800° C. or more).

In accordance with various embodiments, the substrate may include the adhesion layer. By way of example, the monocrystalline substrate segment can be arranged between the adhesion layer and the desired separating layer.

In accordance with various embodiments, the securing can be carried out by bringing the adhesion layer into physical contact with the additional substrate.

In accordance with various embodiments, the adhesion layer can be formed by chemically altering (e.g. oxidizing) the first main processing side of the substrate.

In accordance with various embodiments, the chemical altering may include oxidizing. By way of example, the adhesion layer may include or be formed from a native oxide layer of the substrate. In other words, the adhesion layer may include or be formed from an oxide of the semiconductor material of the substrate.

In accordance with various embodiments, the additional substrate may include an electrode (of the micromechanical structure), or the electrode (of the micromechanical structure) can be formed by means of the at least one monocrystalline substrate segment. By way of example, the micromechanical structure formed may include the electrode. Optionally, the electrode may include a plurality of through openings.

The first substrate segment and/or the second substrate segment can have a greater mechanical hardness and/or a greater modulus of elasticity than the electrode, e.g. if the latter is provided by means of the additional substrate.

In accordance with various embodiments, forming the micromechanical structure can furthermore include: forming the electrode above the additional substrate, wherein the electrode is arranged between the monocrystalline substrate segment and the additional substrate; or wherein the electrode includes or is formed from the monocrystalline substrate segment.

In accordance with various embodiments, forming the micromechanical structure may include forming a cavity between the electrode and the at least one monocrystalline substrate segment.

In accordance with various embodiments, forming the micromechanical structure may include forming an additional electrode, wherein the at least one monocrystalline substrate segment is arranged between the additional electrode and the additional substrate; or wherein the additional electrode includes the at least one monocrystalline substrate segment or is formed at least by means of the latter.

The first substrate segment and/or the second substrate segment can have a greater mechanical hardness and/or a greater modulus of elasticity than the additional electrode, e.g. if the latter is formed above the first substrate segment.

In accordance with various embodiments, forming the electrode and/or the additional electrode may include forming a plurality of through openings in the electrode or additional electrode.

In accordance with various embodiments, forming the micromechanical structure may include forming a sensor (e.g. pressure sensor or microphone) or actuator (e.g. sound emitter) including the monocrystalline substrate segment.

In accordance with various embodiments, forming the micromechanical structure may include forming a membrane or a cantilever including the at least one monocrystalline substrate segment or formed at least by means of the latter.

In accordance with various embodiments, forming the micromechanical structure may include exposing the at least one monocrystalline substrate segment on opposite sides.

In accordance with various embodiments, forming the micromechanical structure may include electrically contacting the at least one monocrystalline substrate segment.

In accordance with various embodiments, the method can furthermore include: altering a mechanical characteristic and/or electrical characteristic of the at least one monocrystalline substrate segment by means of an ion implantation.

In accordance with various embodiments, introducing a second impurity into the monocrystalline substrate segment can be carried out by means of the ion implantation (also referred to as second ion implantation). The second impurity can be different than the first impurity.

In accordance with various embodiments, altering the mechanical characteristic and/or electrical characteristic of the at least one monocrystalline substrate segment can be carried out before the severing or after the severing.

In accordance with various embodiments, the method can furthermore include: forming an additional micromechanical structure including the other monocrystalline substrate segment of the two substrate segments or at least one part thereof.

In accordance with various embodiments, the at least two substrate segments may include three substrate segments (e.g. of which an additional substrate segment includes an additional monocrystalline layer); wherein the micromechanical structure includes two substrate segments of the three substrate segments and/or wherein the method furthermore includes: forming the additional micromechanical structure including a different substrate segment of the three substrate segments.

In accordance with various embodiments, the substrate segment may include at least one of the following: (e.g. monocrystalline) silicon carbide, (e.g. monocrystalline) gallium nitride, a greater modulus of elasticity than one of the following: polysilicon, the substrate and/or than 200 GPa (e.g. in a range of approximately 200 GPa to approximately 600 GPa), a greater mechanical hardness than one of the following: polysilicon, the substrate and/or than 20 GPa (e.g. in a range of approximately 20 GPa to approximately 50 GPa) and/or a larger (e.g. laterally extended) monocrystalline region than the substrate.

In accordance with various embodiments, a micromechanical structure may include the following: a substrate; a functional structure arranged at the substrate; wherein the functional structure includes a functional region (also referred to as deflectable region), which is deflectable relative to the substrate as a reaction to a force acting thereon; and wherein the functional region includes or is formed from a monocrystalline semiconductor material, e.g. monocrystalline silicon carbide (SIC), monocrystalline gallium nitride (GaN) or monocrystalline silicon (Si).

In accordance with various embodiments, a micromechanical structure may include the micromechanical structure in accordance with various embodiments and an electrode at the substrate, wherein the functional region is deflectable relative to the electrode as reaction to the force acting thereon.

In accordance with various embodiments, a micromechanical structure may include the following: a substrate; a functional structure and an electrode, which are arranged at the substrate; wherein the functional structure includes a functional region, which is deflectable relative to the electrode as a reaction to a force acting thereon; and wherein the electrode includes or is formed from a monocrystalline semiconductor material, e.g. monocrystalline silicon carbide (SiC), monocrystalline gallium nitride (GaN) or monocrystalline silicon (Si).

In accordance with various embodiments, the functional region can be coupled to the substrate, e.g. in direct physical contact and/or by means of a securing section.

In accordance with various embodiments, a micromechanical structure may include the following: a substrate including a cavity; a monocrystalline semiconductor layer (e.g. a monocrystalline substrate segment) including a first section (also referred to as securing section) and a second section (also referred to as freely suspended section) (e.g. adjoining said first section); wherein the second section adjoins the cavity and is coupled to the substrate by means of the first section.

In accordance with various embodiments, the first section can be at a distance from the cavity.

In accordance with various embodiments, at least one region of the substrate and/or the second section can be arranged between the first section and the cavity.

In accordance with various embodiments, the micromechanical structure can furthermore include: a functional structure having a functional region, which is deflectable relative to the substrate (e.g. into the cavity) as a reaction to a force acting thereon; wherein the second section includes or is formed from the functional region.

In accordance with various embodiments, the micromechanical structure can furthermore include: an electrode arranged at the substrate; a functional structure including a functional region, which is deflectable relative to the electrode (e.g. into the cavity) as a reaction to a force acting thereon; and wherein the electrode includes the second section.

In accordance with various embodiments, the cavity can be arranged between the electrode and the functional region and/or adjoin them.

In accordance with various embodiments, the second section may include at least one of the following: silicon carbide and/or gallium nitride, a greater modulus of elasticity than the substrate; and/or a greater mechanical hardness than the substrate.

In accordance with various embodiments, the second section may include at least one of the following: (e.g. monocrystalline) silicon carbide, (e.g. monocrystalline) gallium nitride, a greater modules of elasticity than one of the following: polysilicon, the substrate and/or than 200 GPa (e.g. in a range of approximately 200 GPa to approximately 600 GPa), a greater mechanical hardness than one of the following: polysilicon, the substrate and/or than 20 GPa (e.g. in a range of approximately 20 GPa to approximately 50 GPa) and/or a larger (e.g. laterally extended) monocrystalline region than the substrate.

In accordance with various embodiments, the micromechanical structure can furthermore include: an additional (e.g. polycrystalline) semiconductor layer (e.g. including or formed from silicon), which differs from the monocrystalline semiconductor layer in terms of its modules of elasticity and/or in terms of its mechanical hardness; wherein the cavity is arranged between the monocrystalline semiconductor layer and the additional semiconductor layer and/or adjoins them.

In accordance with various embodiments, an electromechanical transducer may include the following: a substrate; a micromechanical structure in double electrode configuration (e.g. a capacitive sensor structure); wherein the microelectromechanical structure includes at least one freely suspended section (e.g. a layer), wherein the at least one freely suspended section may include at least one of the following: (e.g. monocrystalline) silicon carbide, (e.g. monocrystalline) gallium nitride, a greater modulus of elasticity than one of the following: polysilicon, the substrate and/or than 200 GPa (e.g. in a range of approximately 200 GPa to approximately 600 GPa), a greater mechanical hardness than one of the following: polysilicon, the substrate and/or than 20 GPa (e.g. in a range of approximately 20 GPa to approximately 50 GPa) and/or a larger (e.g. laterally extended) monocrystalline region than the substrate.

The freely suspended section can be formed in accordance with the double electrode configuration, for example as part of an electrode and/or as part of a membrane and/or as part of a cantilever. By way of example, the double electrode configuration can provide two cavities, at least one (e.g. both) of which adjoin the freely suspended section. Alternatively or additionally, the double electrode configuration can provide the freely suspended section and two additional freely suspended sections, of which at least a first freely suspended section is part of a first electrode, a second freely suspended section is part of a second electrode and a third freely suspended section is part of a functional region and/or is arranged between the first electrode and the second electrode. The freely suspended section can for example adjoin a cavity of the substrate.

In accordance with various embodiments, the electromechanical transducer can furthermore include a securing section, which is monolithically connected to the freely suspended section and by means of which the at least one freely suspended section is coupled to the substrate (e.g. secured thereon).

In accordance with various embodiments, the at least one freely suspended section may include or be formed from a substrate segment (e.g. the layer).

In accordance with various embodiments, an electromechanical transducer may include the following: a substrate; a microelectromechanical structure in double electrode configuration (e.g. a capacitive sensor structure); wherein the microelectromechanical structure includes at least one substrate segment (e.g. a layer), wherein the substrate segment can be include or be formed from (e.g. monocrystalline) silicon carbide and/or (e.g. monocrystalline) gallium nitride.

In accordance with various embodiments, the electromechanical transducer may include two electrodes, at least one electrode of which includes or is formed from the at least one freely suspended section, e.g. the at least one substrate segment (e.g. the layer).

In accordance with various embodiments, the electromechanical transducer (e.g. a capacitive sensor) may include at least one functional region, which is deflectable relative to the substrate as a reaction to a force acting thereon; wherein the at least one freely suspended section, e.g. the at least one substrate segment (e.g. the layer), includes the functional region. Optionally, the at least one substrate segment (e.g. the layer) may include the anchored section, by means of which the functional region is coupled to the substrate (e.g. secured thereon).

In accordance with various embodiments, the functional region can be coupled to the substrate, e.g. in direct physical contact and/or by means of an anchored section (also referred to as securing section) of the substrate segment (e.g. of the layer).

In accordance with various embodiments, the at least one freely suspended section, e.g. the at least one substrate segment (e.g. the layer), may include or be formed from monocrystalline silicon carbide.

In accordance with various embodiments, a method may include the following: forming a desired separating layer in a monocrystalline substrate; severing the substrate along (e.g. in) the desired separating layer, such that a monocrystalline layer is divided off from the substrate; and forming a micromechanical structure including the monocrystalline layer.

In accordance with various embodiments, a method may include the following: forming a desired separating layer in a monocrystalline substrate; securing the substrate on an additional substrate; wherein a substrate segment of the substrate is arranged between the desired separating layer and the additional substrate; severing the substrate in the desired separating layer; and forming a micromechanical structure including at least the substrate segment (and optionally the additional substrate and/or optionally an additional substrate segment of the substrate).

In accordance with various embodiments, a method for processing a substrate (including or formed from a monocrystalline region) may include the following: severing the monocrystalline region into at least two partial regions (of which for example at least one first partial region includes a monocrystalline layer); and forming a micromechanical structure including at least one partial region (also referred to as first partial region) of the two partial regions.

In accordance with various embodiments, a method can be configured for processing a substrate, wherein the substrate includes: a first main processing side and a second main processing side, which are situated opposite one another; a monocrystalline region on the first main processing side (e.g. adjoining both main processing sides). The method may include the following: separating (e.g. severing) the substrate through the monocrystalline region and along the first main processing side into at least two substrate segments, of which at least one substrate segment (also referred to as first substrate segment) includes a monocrystalline layer of the monocrystalline region; and forming a micromechanical structure including the monocrystalline layer.

In accordance with various embodiments, the first substrate segment, e.g. the monocrystalline layer, can be structured.

In accordance with various embodiments, the micromechanical structure may include a stiffening structure, wherein the stiffening structure includes the substrate segment. Optionally, the substrate segment of the stiffening structure can be structured.

In accordance with various embodiments, the substrate segment of the micromechanical structure may include a suspension point of the micromechanical structure, i.e. a fixed contact point with the additional substrate.

In accordance with various embodiments, a method for forming a micromechanical structure may include the following: transferring at least one substrate segment (e.g. a monocrystalline layer) from a first substrate to a second substrate; and forming a micromechanical structure including the at least one substrate segment (e.g. the monocrystalline layer).

In accordance with various embodiments, the first substrate and the second substrate can differ in their chemical composition and/or in their crystallization type (i.e. polycrystalline or monocrystalline). By way of example, the first substrate can be monocrystalline and/or the second substrate can be polycrystalline.

The monocrystalline substrate segment (e.g. the monocrystalline layer) may include or be formed from at least one of the following: SiC, GaN or Si.

Transferring the monocrystalline substrate segment (e.g. the monocrystalline layer) can be carried out by means of a Smartcut process in accordance with various embodiments.

Before or after transferring the monocrystalline substrate segment (e.g. the monocrystalline layer), altering the monocrystalline substrate segment (e.g. the monocrystalline layer) can be carried out, e.g. chemically and/or structurally.

The altering can alter for example the mechanical characteristic of the monocrystalline substrate segment (e.g. of the monocrystalline layer) (e.g. the stress and/or prestress thereof) and/or can alter the electrical properties of the monocrystalline substrate segment (e.g. of the monocrystalline layer) (e.g. the electrical conductivity thereof).

In accordance with various embodiments, the micromechanical structure can be provided in a double electrode configuration or a single electrode configuration, e.g. a top single electrode configuration or bottom single electrode configuration.

In accordance with various embodiments, during hydrophilic bonding it is possible to exploit the fact that water molecules chemisorb on a hydrophilic surface (e.g. of a substrate), as a result of which hydroxyl groups (e.g. in silanol) are formed. If two surfaces including chemisorbed water molecules are brought into physical contact with one another, a polymerization of the hydroxyl groups begins (e.g. with release of water), e.g. at a temperature as low as room temperature. An optional annealing process (e.g. at a temperature in a range of approximately 110° C. to approximately 800° C.) can reinforce this reaction and thus reinforce the adhesion force of the two surfaces with respect to one another. The hydrophilic surface can be provided for example by means of an oxide layer, e.g. by means of a silicon oxide layer.

In accordance with various embodiments, a ratio (also referred to as aspect ratio) of the lateral extent of the freely suspended section to the vertical extent of the freely suspended section can be greater than approximately $1 \cdot 10^3$, e.g. greater than approximately $2 \cdot 10^3$, e.g. greater than approximately $4 \cdot 10^3$, e.g. greater than approximately $6 \cdot 10^3$.

The lateral extent of the freely suspended section can correspond for example to the lateral extent (e.g. diameter) of the cavity or of the opening of the substrate which is adjoined by the freely suspended section. The vertical extent of the freely suspended section can correspond for example to the distance between two cavities between which the freely suspended section is arranged.

By way of example, the lateral extent can be in a range of approximately 400 μm to approximately 1000 μm, e.g. in a range of approximately 600 μm to approximately 850 μm. Alternatively or additionally, the vertical extent can be in a range of approximately 100 nm to approximately 1000 nm, e.g. in a range of approximately 150 nm to approximately 350 nm. In other embodiments, the vertical extent can also be greater than 1 μm.

By way of example, a membrane (e.g. of a microphone) can have a membrane diameter of approximately 540 μm and a membrane thickness of approximately 330 nm, which results in an aspect ratio of approximately $1.6 \cdot 10^3$.

In accordance with various embodiments, the freely suspended section can provide a deflectable region. The freely suspended section can have a lower stiffness and/or a flexural strength than the first electrode and/or than the second electrode. The stiffness can describe the elastic deformation (e.g. deflection) per acting force. The flexural strength can describe the flexure per acting bending moment.

In accordance with various embodiments, the micromechanical structure may include at least two freely suspended sections, of which a first freely suspended section is formed using a substrate segment and has a greater modulus of elasticity and/or a greater mechanical hardness than the second freely suspended section of the two freely suspended sections. The first freely suspended section can for example include or be formed from (e.g. monocrystalline) SiC and/or include or be formed from (e.g. monocrystalline) gallium nitride. Alternatively or additionally, the first freely suspended section may include a larger (e.g. laterally extended) monocrystalline region than the second freely suspended section and/or than the substrate.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A micromechanical structure, comprising:
   a substrate comprising a cavity;
   a monocrystalline semiconductor layer comprising a first section and a second section;
   wherein the second section adjoins the cavity and is coupled to the substrate by means of the first section;
   further comprising a functional structure comprising a functional region, which is deflectable relative to the substrate as a reaction to a force acting thereon;
   wherein the second section comprises the functional region.

2. The micromechanical structure of claim 1, further comprising:
   an electrode arranged at the substrate; and
   a functional structure comprising a functional region, which is deflectable relative to the electrode as a reaction to a force acting thereon;
   wherein the electrode comprises the second section.

3. The micromechanical structure of claim 1, further comprising:
   wherein the second section may include at least one of the following:
   silicon carbide;
   gallium nitride;
   a greater modulus of elasticity than the substrate; and
   a greater mechanical hardness than the substrate.

4. The micromechanical structure of claim 1, further comprising:
   an additional semiconductor layer, which differs from the monocrystalline semiconductor layer in its modulus of elasticity and/or in its mechanical hardness;
   wherein the cavity is arranged between the monocrystalline semiconductor layer and the additional semiconductor layer.

5. An electromechanical transducer, comprising:
   a substrate;
   a microelectromechanical structure in double electrode configuration;
   wherein the microelectromechanical structure comprises at least one freely suspended section, wherein the at least one freely suspended section comprises at least one of silicon carbide, gallium nitride or has a greater modulus of elasticity than the substrate.

6. The electromechanical transducer of claim 5, further comprising:
   two electrodes, of which at least one electrode comprises the at least one freely suspended section.

7. The electromechanical transducer of claim 5,
   wherein the microelectromechanical structure comprises at least one functional region, which is deflectable relative to the substrate as a reaction to a force acting thereon;
   wherein the at least one freely suspended section comprises the functional region.

8. The electromechanical transducer of claim 5,
   wherein the at least one freely suspended section comprises at least one of monocrystalline silicon carbide or monocrystalline gallium nitride.

* * * * *